United States Patent
Watanabe et al.

(10) Patent No.: US 9,419,508 B2
(45) Date of Patent: Aug. 16, 2016

(54) DRIVING APPARATUS FOR DRIVING SWITCHING ELEMENTS OF POWER CONVERSION CIRCUIT

(71) Applicant: DENSO CORPORATION, Kariya, Aichi-pref. (JP)

(72) Inventors: Kazunori Watanabe, Anjo (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/536,120

(22) Filed: Nov. 7, 2014

(65) Prior Publication Data
US 2015/0124502 A1    May 7, 2015

(30) Foreign Application Priority Data

Nov. 7, 2013 (JP) .................................. 2013-231237

(51) Int. Cl.
| | | |
|---|---|---|
| *H02M 3/315* | (2006.01) | |
| *H02M 1/08* | (2006.01) | |
| *H02M 1/38* | (2007.01) | |
| *H02M 7/5387* | (2007.01) | |

(Continued)

(52) U.S. Cl.
CPC *H02M 1/08* (2013.01); *H02M 1/38* (2013.01); *H02M 7/5387* (2013.01); *H03K 17/166* (2013.01); *H03K 17/168* (2013.01); *H02M 2001/0009* (2013.01); *H03K 17/04206* (2013.01)

(58) Field of Classification Search
CPC . H02M 1/32; H02M 1/4208; H02M 3/33507; H02M 7/48; H02M 7/537; H02M 7/003; H02M 3/33523

USPC .............................. 363/56.01, 78, 95, 97, 131
See application file for complete search history.

(56) References Cited

U.S. PATENT DOCUMENTS

| | | | | |
|---|---|---|---|---|
| 5,055,703 A | * | 10/1991 | Schornack | .............. H02J 9/062 307/64 |
| 5,747,972 A | * | 5/1998 | Baretich | ................. G06F 1/613 323/223 |

(Continued)

FOREIGN PATENT DOCUMENTS

| | | |
|---|---|---|
| JP | 10-337046 | 12/1998 |
| JP | 2013-118756 | 6/2013 |

(Continued)

OTHER PUBLICATIONS

Office Action (2 pgs.) dated Sep. 1, 2015 issued in corresponding Japanese Application No. 2013-231237 with an at least partial English-language translation (3 pgs.).

*Primary Examiner* — Adolf Berhane
(74) *Attorney, Agent, or Firm* — Nixon & Vanderhye P.C.

(57) ABSTRACT

A driving apparatus for driving switching elements of a power conversion circuit. In the apparatus, a first determination unit determines whether or not a dead time that occurs immediately after a setting of discharge rate is changed is greater than the dead time assumed at the time of designing. When the dead time occurring immediately after the setting of discharge rate is changed is greater than the dead time assumed at the time of designing, a shift unit shifts in time at least one of transition to an OFF state of one of the upper-arm and lower-arm switching elements and transition to an ON state of the other of the upper-arm and lower-arm switching elements immediately after the transition to the OFF state so as to reduce a time difference between the transition to the OFF state and the transition to the ON state.

10 Claims, 16 Drawing Sheets

(51) Int. Cl.
*H03K 17/16* (2006.01)
*H02M 1/00* (2006.01)
*H03K 17/042* (2006.01)

(56) References Cited

U.S. PATENT DOCUMENTS

| | | | |
|---|---|---|---|
| 5,929,665 A | 7/1999 | Ichikawa et al. | |
| 2013/0021831 A1* | 1/2013 | Kitabatake | H02M 7/5387 363/131 |
| 2013/0181640 A1 | 7/2013 | Fukuta et al. | |
| 2013/0181749 A1 | 7/2013 | Hamanaka | |
| 2015/0311821 A1* | 10/2015 | Kondo | H02M 7/537 363/97 |

FOREIGN PATENT DOCUMENTS

| | | |
|---|---|---|
| JP | 2013-143881 | 7/2013 |
| JP | 2013-143882 | 7/2013 |
| JP | 2013-172617 | 9/2013 |

\* cited by examiner

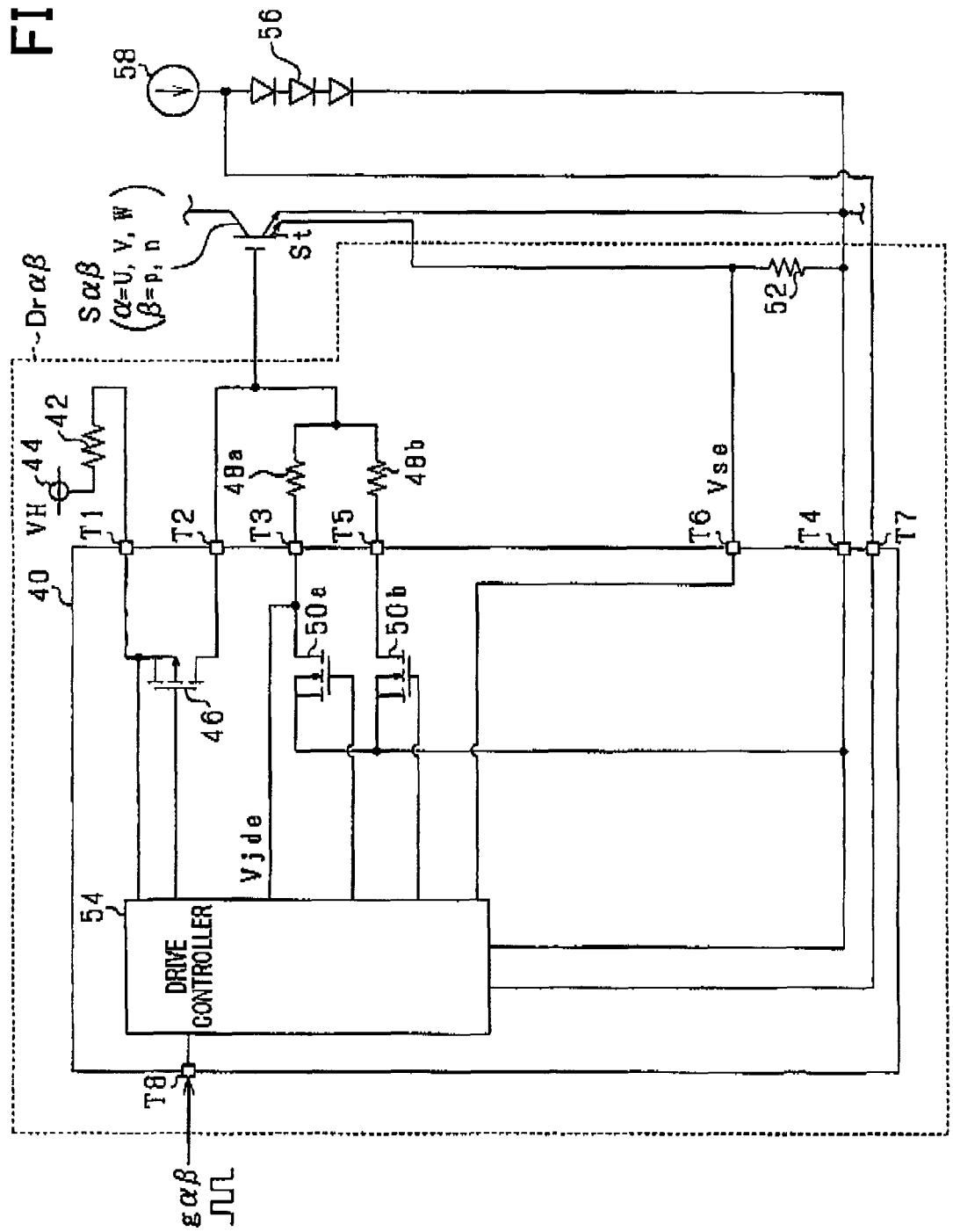

HIGHER DISCHARGE RATE | LOWER DISCHARGE LATE gαβ : H(OFF) / L(ON)

SW50a : ON / OFF

SW50b : ON / OFF t1, t2, TIME

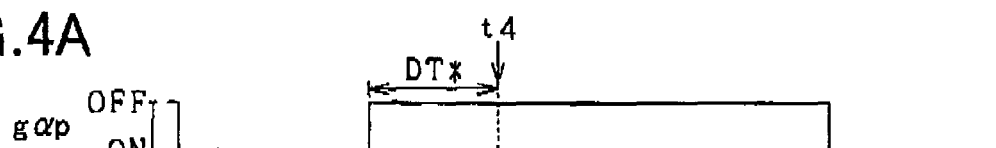
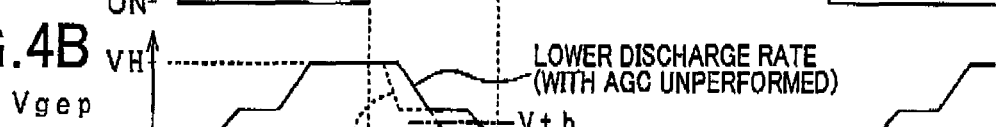
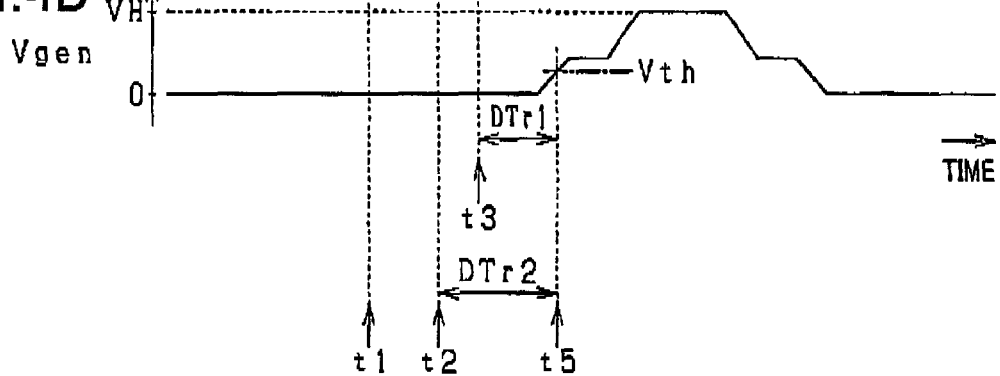

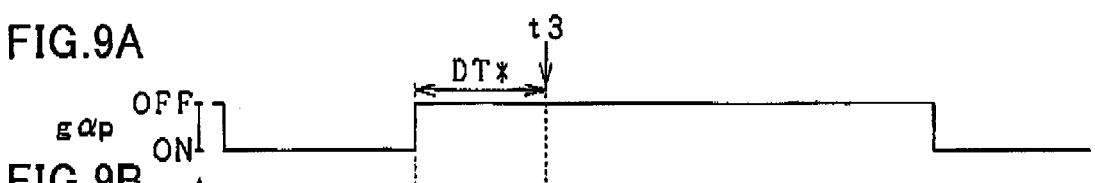
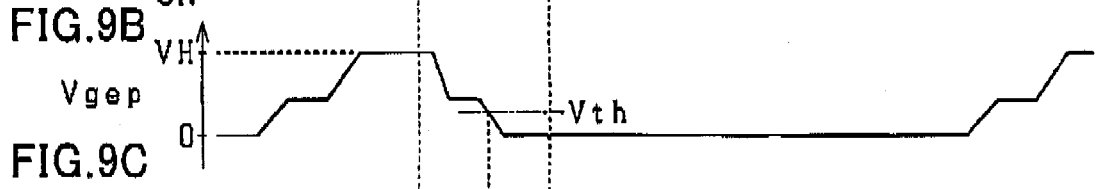
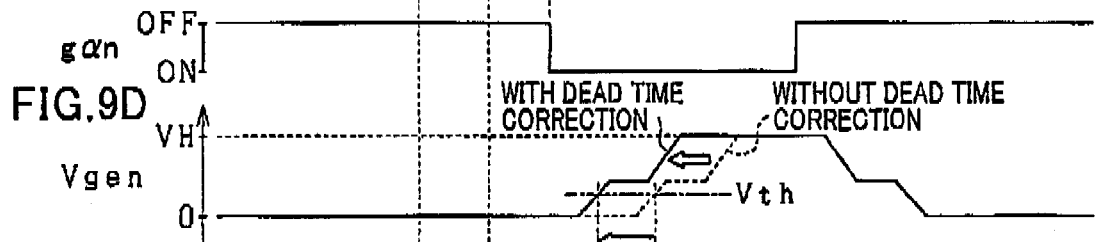
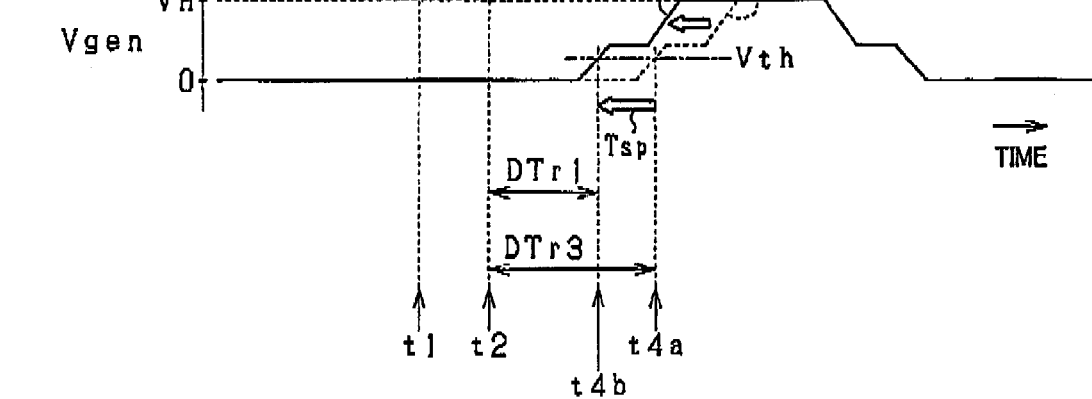

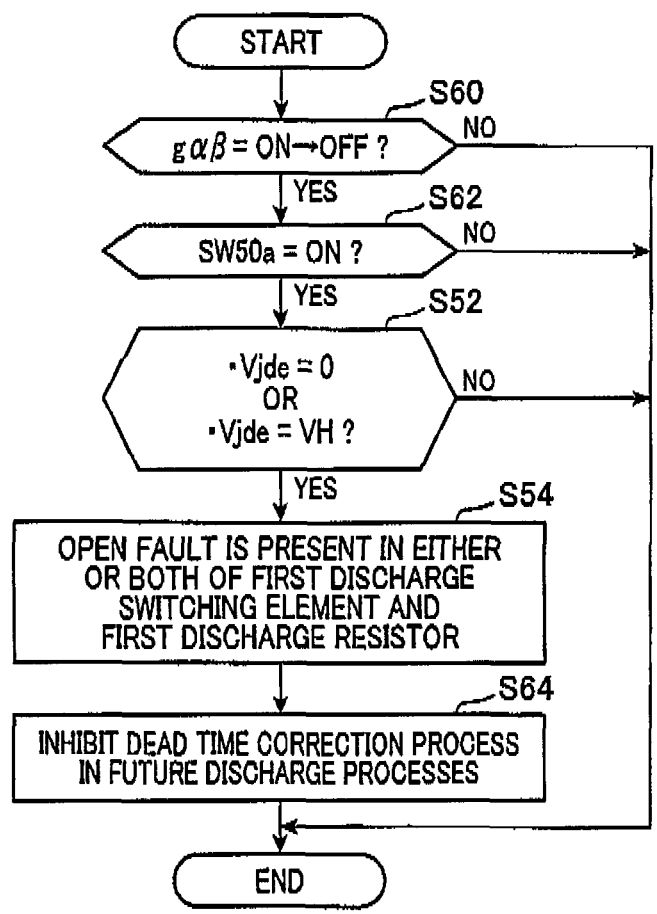

DRIVING APPARATUS FOR DRIVING SWITCHING ELEMENTS OF POWER CONVERSION CIRCUIT

CROSS-REFERENCE TO RELATED APPLICATION

This application is based on and claims the benefit of priority from earlier Japanese Patent Applications No. 2013-231237 filed Nov. 7, 2013, the descriptions of which are incorporated herein by reference.

BACKGROUND

1. Technical Field

The present invention relates to a driving apparatus for driving switching elements of a power conversion circuit, configured such that a series connection of upper-arm and lower-arm switching elements is electrically connected in parallel with a DC power source.

2. Related Art

A known driving apparatus for driving switching elements of a power conversion circuit, as disclosed in Japanese Patent Application Laid-Open Publication No. 2013-143882, assumes active gate control of insulated-gate bipolar transistors (IGBTs) (as the switching elements) forming a three-phase inverter. The active gate control refers to a technique for changing or altering a setting of discharge rate from a higher one to a lower one within a time period from start to completion of discharging of the gate charge.

To avoid the phenomenon where that the upper-arm switching element and the lower-arm switching element are both ON (so called upper-and-lower-arm short-circuit), there is provided a dead time from transition to an OFF state of one of the upper-arm switching element and the lower-arm switching element and transition to an ON state of the other of the upper-arm switching element and the lower-arm switching element.

In the driving apparatus supporting the active gate control, as described later in more detail, an actual dead time may become greater than a dead time assumed at the time of designing. The dead time assumed at the time of designing is determined by leaving a discharge rate set to a lower rate during the discharge process with no active gate control performed to avoid the upper-and-lower-arm short-circuit.

An actual dead time excessively greater than the dead time assumed at the time of designing may cause a current waveform output from the inverter to be much deformed from a waveform (e.g., a sine wave), which may degrade the torque controllability of a rotary machine connected to the inverter.

In consideration of the foregoing, exemplary embodiments of the present invention are directed to providing a driving apparatus for driving switching elements of a power conversion circuit, capable of preventing a dead time from becoming excessively large.

SUMMARY

In accordance with an exemplary embodiment of the present invention, there is provided a driving apparatus for driving switching elements of a power conversion circuit. The power conversion circuit has a series connection of an upper-arm switching element and a lower-arm switching element. The series connection is electrically connected in parallel with a direct-current (DC) power source. The apparatus includes a drive control unit configured to, for each of the upper-arm switching element and the lower-arm switching element, turn on or off the switching element by charging or discharging the charge on a switching control terminal of the switching element, the drive control unit being configured to set a dead time for preventing both of the upper-arm switching element and the lower-arm switching element from being ON, the dead time taking a positive value; a discharge-rate changing unit configured to change a setting of discharge rate at which the charge on the switching control terminal of each of the upper-arm switching element and the lower-arm switching element is discharged; a first determination unit configured to determine whether or not the dead time that occurs immediately after the setting of discharge rate is changed by the discharge-rate changing unit is greater than the dead time assumed at the time of designing the apparatus; and a shift unit configured to, when it is determined by the first determination unit that the dead time occurring immediately after the setting of discharge rate is changed by the discharge-rate changing unit is greater than the dead time assumed at the time of designing the apparatus, shift in time at least one of transition to an OFF state of one of the upper-arm switching element and the lower-arm switching element and transition to an ON state of the other of the upper-arm switching element and the lower-arm switching element that is immediately after the transition to the OFF state so as to reduce a time difference between the transition to the OFF state and the transition to the ON state.

With this configuration, the discharge-rate changing unit allows the setting of discharge rate to be changed. This allows a turn-off time of each switching element to be changed, thereby allowing an actual dead time to be changed. When it is determined by the first determination unit that the dead time that occurs immediately after the setting of discharge rate is changed by the discharge-rate changing unit is greater than the dead time assumed at the time of designing the apparatus, the shift unit may shift in time at least one of transition to an OFF state of one of the upper-arm switching element and the lower-arm switching element and transition to an ON state of the other of the upper-arm switching element and the lower-arm switching element that is immediately after the transition to the OFF state. This allows the dead time that occurs immediately after the setting of discharge rate is changed by the discharge-rate changing unit to approach the dead time assumed at the time of designing the apparatus, thereby preventing the dead time from becoming excessively large. For example, a current waveform from the power conversion circuit may be prevented from being much deformed from a sine wave.

BRIEF DESCRIPTION OF THE DRAWINGS

FIG. 2A shows a schematic diagram of a drive circuit for driving one of insulated gate bipolar transistors (IGBTs) in accordance with the first embodiment;

FIGS. 4A-4D show a timing chart for explaining dead time extension;

FIG. 9A-9D show a timing chart for explaining the dead time correction process in accordance with the second embodiment;

FIG. 11A shows a flowchart of a dead time correction inhibition process in accordance with a fourth embodiment;

DESCRIPTION OF SPECIFIC EMBODIMENTS (First Embodiment)

There will now be explained a driving apparatus for driving switching elements of a power conversion circuit, which may be applied to a vehicle mounting therein a rotary machine (such as a hybrid vehicle or an electrical vehicle), in accordance with a first embodiment of the present invention with reference to accompanied drawings.

Figure 1:
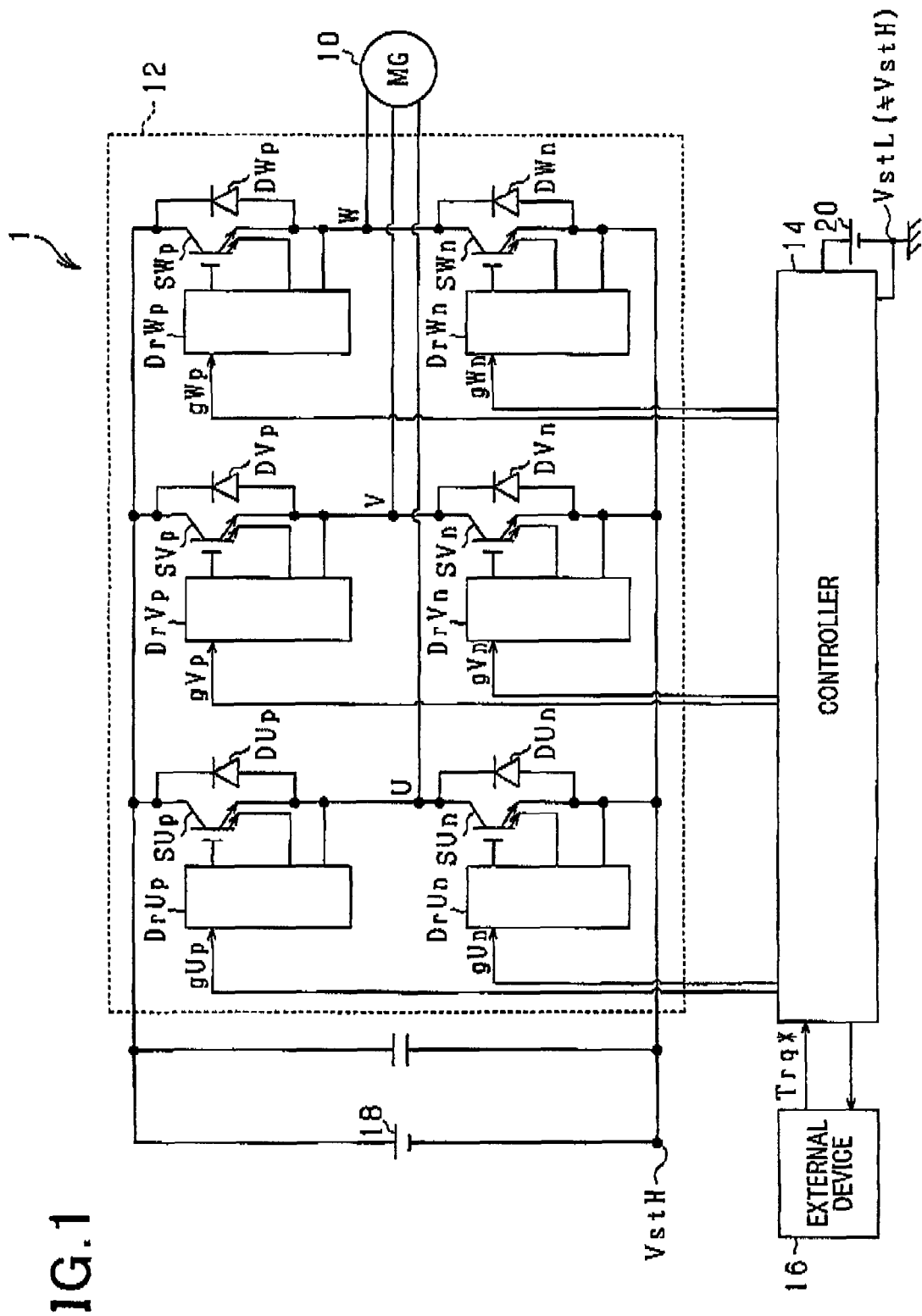
FIG. 1. shows a schematic diagram of a motor control system in accordance with a first embodiment of the present invention.

As shown in FIG. 1, a motor control system 1 includes a motor generator 10, an inverter 12 (as the power conversion circuit), a controller 14 configured to control the motor generator 10, an external device 16 configured to bundle vehicle controls. The motor generator 10 is a multi-phase rotary machine (in this case a three-phase rotary machine) as a vehicle prime mover and is connected to a driven wheel (not shown). The motor generator 10 is electrically connected to a high-voltage battery 18 through the inverter 20. The high-voltage battery 18 is a secondary battery having a terminal voltage of 100V or more, such as a lithium-ion secondary battery, a nickel-metal-hydride secondary battery or the like. A synchronous motor, such as a permanent magnet synchronous motor (PMSM), may be used as the motor generator 10.

The inverter 12 includes three series connections of switching elements: a first series connection of upper-arm and lower-arm switching elements SUp, SUn, a second series connection of upper-arm and lower-arm switching elements SVp, SVn, and a third series connection of upper-arm and lower-arm switching elements SWp, SWn. A junction of the first series connection of upper-arm and lower-arm switching elements SUp, SUn is electrically connected to a U-phase terminal of the motor generator 10, a junction of the second series connection of upper-arm and lower-arm switching elements SVp, SVn is electrically connected to a V-phase terminal of the motor generator 10, and a junction of the third series connection of upper-arm and lower-arm switching elements SWp, SWn is electrically connected to a W-phase terminal of the motor generator 10. In the present embodiment, each of the switching elements $S\alpha\beta$ ($\alpha$=U, V, W, $\beta$=p, n) is a voltage-controlled semiconductor switching element, more specifically, an insulated gate bipolar transistor (IGBT), and is electrically connected in anti-parallel with a respectively corresponding freewheel diode $D\alpha\beta$ (not shown).

The controller 14 is microcomputer-based and is powered by a low-voltage battery 20 having a lower output voltage than the high-voltage battery 18. The controller 14 operates the inverter 12 to control a controlled variable (in this case a torque) of the motor generator 10 to its command value (hereinafter referred to as a command torque Trq*). More specifically, the controller 14 generates and outputs upper-arm and lower-arm operation signals $g\alpha p$, $g\alpha n$ to upper-arm and lower-arm drive circuits $D\alpha p$, $D\alpha n$ associated with the respective upper-arm and lower-arm switching elements SUp, SUn to thereby operate the upper-arm and lower-arm switching elements $S\alpha p$, $S\alpha n$. The upper-arm operation signals $g\alpha\beta$ and the lower-arm operation signals $g\alpha n$ are complementary to each other. That is, each of the upper-arm switching elements $S\alpha p$ and a corresponding one of the lower-arm switching elements $S\alpha n$ are alternately put in the on-state.

The external device 16 is an upper-level device that is present outside the controller 14 and within the vehicle. The external device 16 is configured to set the command torque Trq* of the motor generator 10 and outputs the command torque Trq* to the controller 14.

In the present embodiment, the vehicle includes a high-voltage system and a low-voltage system. The high-voltage system includes the motor generator 10, the inverter 12, and the high-voltage battery 18. The low-voltage system includes the controller 14, the external device 16, and the low-voltage battery 20. In the present embodiment, a reference potential VstL of the low-voltage system and a reference potential VstH of the high-voltage system are different from each other. In particular, in the present embodiment, the reference potential VstH of the high-voltage system is set to a negative-electrode potential of the high-voltage battery 18, and a reference potential VstL of the low-voltage system is set to a potential of the vehicle body that is a median of the positive-electrode and negative-electrode potentials of the high-voltage battery 18.

The drive circuit $Dr\alpha\beta$ ($\alpha$=U, V, W, $\beta$=p, n) will now be explained in configuration with reference to FIG. 2A.

As shown in FIG. 2A, the drive circuit $Dr\alpha p$ includes a drive integrated circuit (IC) 40, which may be a single chip semiconductor integrated circuit (IC). A first terminal T1 of the drive IC 40 is electrically connected to a constant-voltage power supply 44 through a charge resistor 42. The constant-voltage power supply 44 is provided to apply a voltage VH (of 15 volts in this case) to a switching control terminal (referred to as a gate) of the switching element $S\alpha\beta$.

The first terminal T1 is electrically connected to a second terminal T2 of the drive IC 40 through a charge switching element 46, which may be a P-channel MOSFET. The second terminal 12 is electrically connected to the switching control terminal (gate) of the switching element $S\alpha\beta$.

The gate of the switching element $S\alpha\beta$ is electrically connected to a third terminal T3 of the drive IC 40 through a first discharge resistor 48a. The third terminal T3 is electrically connected to a fourth terminal T4 of the drive IC 40 through a first discharge switching element 50a, which may be an N-channel MOSFET. The gate of the switching element $S\alpha\beta$ is electrically connected to a fifth terminal T5 of the drive IC 40 through a second discharge resistor 48b. The fifth terminal T5 is electrically connected to the fourth terminal 14 of the drive IC 40 through a second discharge switching element

50b, which may be an N-channel MOSFET. The fourth terminal T4 is electrically connected to an output terminal (emitter) of the switching element Sαβ.

The switching element Sαβ is further provided with a sense terminal St for outputting a small current having positive correlation with a current (as a collector current) following through the electrical-current flow path between the emitter and an input terminal (collector) of the switching element Sαβ. The sense terminal St is electrically connected to the emitter of the switching element Sαβ through a sense resistor 52. This leads to a voltage drop across the sense resistor 52 caused by the small current outputted from the sense terminal St. A potential on the sense terminal St side terminal of the sense resistor 52 (hereinafter referred to as a sense voltage Vse) is defined as an electrical state quantity as a function of an amount of voltage drop across the flow path of the switching element Sαβ. The sense voltage Vse is input to a drive controller (as a drive control unit) 54 in the drive IC 40 via a sixth terminal T6 of the drive IC 40.

In the present embodiment, it is assumed that the sense voltage Vse as a potential on the sense terminal St side terminal of the sense resistor 52 is higher than a potential on the emitter of the switching element Sαβ is defined as positive and the potential on the emitter of the switching element Sαβ is at zero.

A temperature-sensitive diode 56 is provided in proximity to the switching element Sαβ to detect a temperature thereof directly (hereinafter referred to as an element temperature). The temperature-sensitive diode 56 is supplied with current from a constant current power supply 58. A cathode of the temperature-sensitive diode 56 is electrically connected to the emitter of the switching element Sαβ and an anode of the temperature-sensitive diode 56 is electrically connected to a seventh terminal T7 of the drive IC 40. With such a configuration, the temperature-sensitive diode 56 outputs a voltage as a function of the element temperature (more specifically, a voltage having negative correlation with the element temperature). The output voltage of the temperature-sensitive diode 56 is to be input to the drive controller 54 via the seventh terminal T7. The drive controller 54 is configured to detect the element temperature based on the output voltage of the temperature-sensitive diode 56.

In the present embodiment, the sense resistor 52 and the sense terminal St form a current detection unit, and the temperature-sensitive diode 56 forms a temperature detection unit.

Figure 2B:
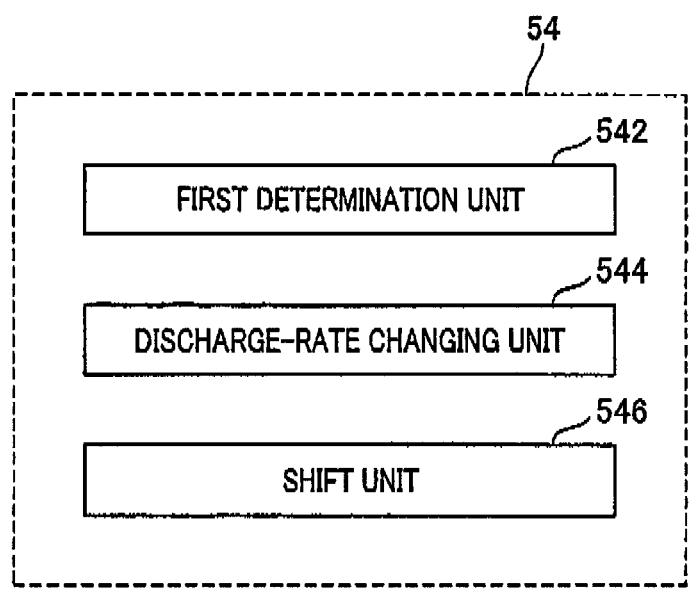
FIG. 2B shows a schematic diagram of a drive controller of FIG. 2A.

Charge and discharge processes to be performed in the drive controller 54 will now be explained. Since the drive controller 54 is hardware, the charge/discharge process is performed in a logic circuit in the present embodiment. Referring to FIG. 2B, the drive controller 54 includes a first determination unit 542, a discharge-rate changing unit 544, and a shift unit 546.

The charge process is performed as follows.

When the drive controller 54 determines that the operation signal gαβ received via an eighth terminal T8 of the drive IC 40 is a turn-on command, the drive controller 54 turns on the charge switching element 46. This enables the gate of the switching element Sαβ to be charged so that the switching element Sαβ is turned on During the charge process, the first and second discharge switching elements 50a, 50b are kept off. In the present embodiment, the turn-on command is low (i.e., at a low logic level) and the turn-off command is high (i.e., at a high logic level).

The discharge process is performed as follows.

In the present embodiment, within a time period from commencement to completion of discharging of the gate charge, the active gate control (AGC) is performed such that a discharge path connected to the gate of the switching element Sαβ is changed from a low-resistance one to a high-resistance one. This active gate control is performed to reduce a surge voltage and switching losses that occur upon transition of the switching element Sαβ from an ON state to an OFF state. The discharge process will be described in detail with reference to FIGS. 3A-3D.

Figure 3A:
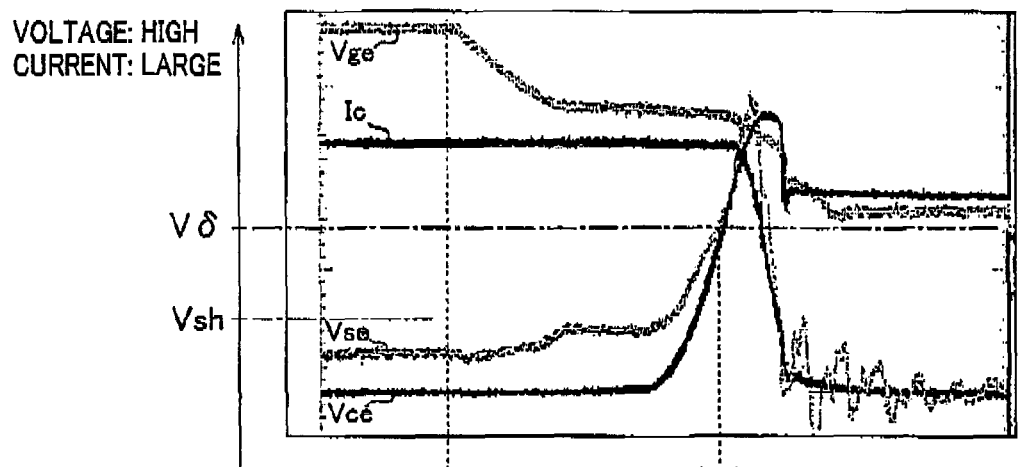
FIG. 3A shows developments of a gate voltage, a collector current, a collector-emitter voltage, and a sense voltage for one of IGBTs.
Figure 3B:
FIG. 3B shows a development of an operation signal input to the drive controller of FIG. 2A.
Figure 3C:
FIG. 3C shows a development of an operational state of a first discharge switching element.
Figure 3D:
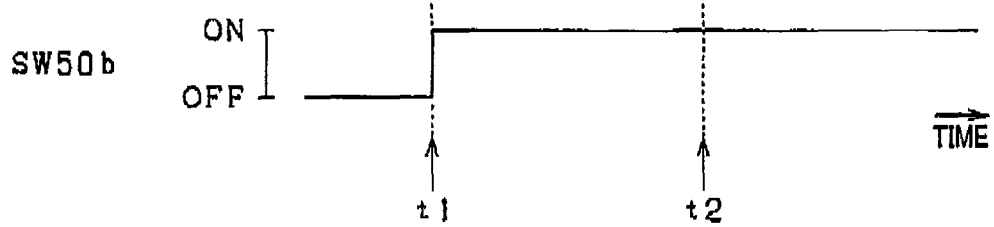
FIG. 3D shows a development of an operational state of a second discharge switching element.

FIGS. 3A-3D show the discharge process of the present embodiment. More specifically, FIG. 3A shows developments of the gate voltage Vge, the collector current IC, the collector-emitter voltage Vce, and the sense voltage Vse. FIG. 3B shows a development of the operation signal gαβ input to the drive controller 54. FIG. 3C is a development of an operational state of the first discharge switching element 50a. FIG. 3D shows a development of an operational state of the second discharge switching element 50b.

As shown in FIGS. 3A-3D, at time t1 when the operation signal gαβ is switched to the turn-off command, both the first discharge switching element 50a and the second discharge switching element 50b are switched to an ON state, whereby the discharge rate is set to a higher rate. This allows the gate charge to discharge via the first discharge resistor 48a and the second discharge resistor 48b.

Thereafter, at time t2 when the sense voltage Vse rises to a specified voltage Vδ, the first discharge switching element 50a is switched to an OFF state, whereby the discharge rate at which the gate charge discharges is changed to a lower rate. The gate charge is discharged through the second discharge resistor 48b. In the present embodiment, the time t2 when the discharge rate is changed is set such that the collector-emitter voltage Vce becomes substantially equal to the voltage of the battery 18. This is because delaying as much as possible the timing of decreasing the discharge rate at which the gate charge discharges can prevent as much as possible the switching rate from being decreased while achieving suppression of the surge voltage.

There is a phenomenon where, in the vicinity of time t2 within the turn-off time of the switching element sαβp, the sense voltage Vse rises significantly. This phenomenon may be caused by the presence of parasitic capacitance between the collector and the emitter of the switching element Sαβ leading to superimposition of the surge voltage on the sense voltage Vse.

In the present embodiment, since reduction of switching losses is given priority over suppression of the surge voltage achieved by the active gate control, the discharge process may be performed without performing the active gate control, while leaving the discharge rate set to the lower rate. In the present embodiment, within a time period where the operation signal gαβ is the turn-on command, the discharge rate setting immediately after this time period has elapsed is determined. More specifically, when it is determined, within a time period where the operation signal gαβ is the turn-on command, that the sense voltage Vse has exceeded a predetermined voltage Vsh, the discharge process is performed while leaving the discharge rate set to the lower rate.

The surge voltage that occurs upon transition of the switching element Sαβ to the OFF state tends to increase with increasing collector current following through the switching element Sαβ in the ON state. This is because a rate of decrease of the collector current during transition of the switching element Sαβ from the ON state to the OFF state increases with increasing collector current following through the switching element Sαβ in the ON state. Hence, when the sense voltage Vse is high, the actual collector-emitter voltage Vce may exceed its acceptable upper limit even when the active gate control is performed. To avoid such a situation, the discharge process may be performed without performing the active gate control, while leaving the discharge rate set to the lower rate.

In the present embodiment, the predetermined voltage Vsh (<Vδ), as shown in FIG. 3A, is compared with the sense voltage Vse after a sufficient time has elapsed for the sense voltage Vse to become stable from the last switching of the operation signal gαβ to the turn-on command (that is, the sense voltage Vse being stable before time t1).

To avoid the phenomenon where the upper-arm switching element Sαp and the lower-arm switching element Sαn are both ON (so called upper-and-lower-arm short-circuit), there is provided a dead time DT* between the transition of the operation signal gαβ to the turn-off command for one of the upper-arm switching element Sαp and the lower-arm switching element Sαn (e.g., at time t1 as shown in FIG. 4A) and the transition of the operation signal gαβ to the turn-on command for the other of the upper-arm switching element Sαp and the lower-arm switching element Sαn (e.g., at time t4 as shown in FIG. 4A) immediately after the transition of the operation signal gαβ to the turn-off command for the one of the upper-arm switching element Sαp and the lower-arm switching element Sαn. As can be seen from FIGS. 4A-4D, an actual dead time DTr2 may be greater than a dead time DTr1 pre-set upon designing the controller 14. This will be explained with reference to FIGS. 4A-4D. FIG. 4A shows a development of an upper-arm operation signal gαβ input to the drive controller 54 forming an upper-arm drive circuit Drαp. FIG. 4B shows a development of a gate voltage of the upper-arm switching element Sαp (hereinafter referred to as an upper-arm gate voltage Vgep). FIG. 4C shows a development of a lower-arm operation signal gαn input to the drive controller 54 forming a lower-arm drive circuit Drαn. FIG. 4D shows a development of a gate voltage of the lower-arm switching element Sαn (hereinafter referred to as a lower arm gate voltage Vgen).

In FIGS. 4A-4D, a time lag is shown from when the operation signal gαβ is logically inverted to when the gate voltage begins to change (i.e., drop or rise) in response to the inversion. Such a time lag is caused by the presence of a time lag from when the operation signal gαβ is input to the drive controller 54 to when either or both of the first and second discharge switching elements 50a, 50b actually transition to an ON state due to the signal delay or the turn-on time or the like.

The discharge process will now be explained, in which no active gate control is to be performed and the discharge rate is set only at the lower rate.

At time t1, the upper-arm operation signal gαβ is switched from the turn-on command to the turn-off command, whereby the upper gate voltage Vgep, as indicated by the solid line in FIG. 4b, begins to fall. At time t3 when the upper gate voltage Vgep falls below a threshold voltage Vth, the upper-arm switching element Sαp is switched to the OFF state.

Thereafter, at time t4, the lower-arm operation signal gαn is switched from the turn-off command to the turn-on command. It should be noted that a time period between time t1 and time t4 is a dead time DT* set in the external device 16. At time t5 when the lower gate voltage Vgen rises above the threshold voltage Vth, the lower-arm switching element Sαn is switched to the ON state.

The discharge process in which the active gate control is performed will now be explained.

In the active gate control, an initial discharge rate is set to a higher rate. Hence, at time t2 prior to time t3 as indicated by the dashed lines in FIG. 4b, the upper-arm gate voltage Vgep falls below a threshold voltage Vth, which allows the upper-arm switching element Sαp to be switched to an OFF state. The actual dead time DTr2 (a time period of time t2 to t5) may thus become greater than the dead time DTr1 (a time period of time t3 to t5) in the case of the discharge rate left set to the lower rate.

This comes from the fact that the dead time assumed at the time of designing is determined by leaving a discharge rate set to the lower rate during the discharge process with no active gate control performed so as to avoid the upper-and-lower-arm short-circuit. In addition, the dead time DTr1 assumed at the time of designing is set so as to prevent the current waveform from being much deformed from a sine wave.

The actual dead time DTr2 excessively greater than the dead time DTr1 may cause the current waveform output from the inverter 12 to be much deformed from a sine wave, which may degrade the torque controllability of the motor generator 10. For example, torque pulsations of the motor generator 10 may be increased.

To avoid this, in the present embodiment, a dead time correction process is performed for the actual dead time DTr2 to approach the dead time DTr1.

Figure 5:
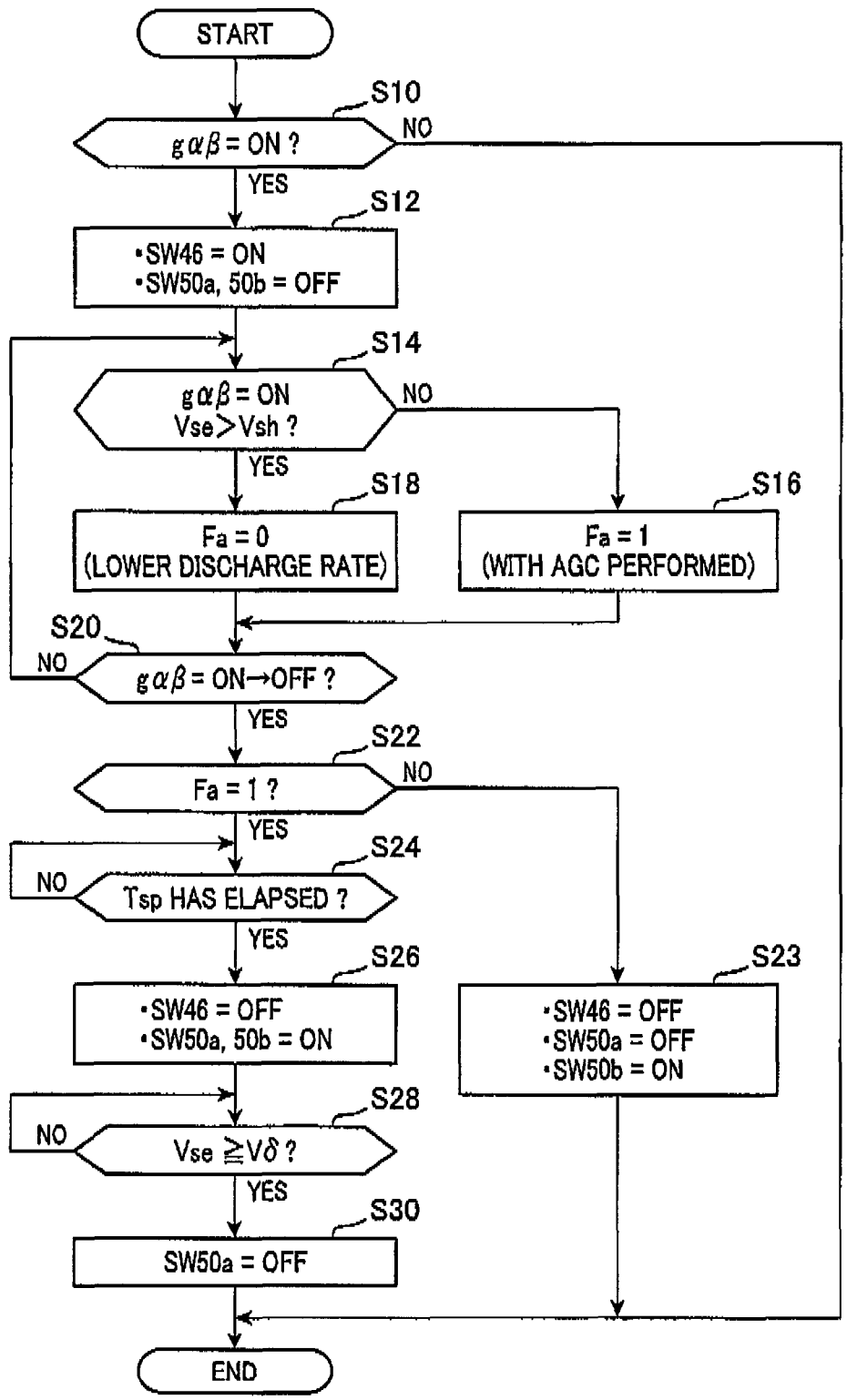
FIG. 5 shows a flowchart of a dead time correction process in accordance with the first embodiment.
Figure 6:
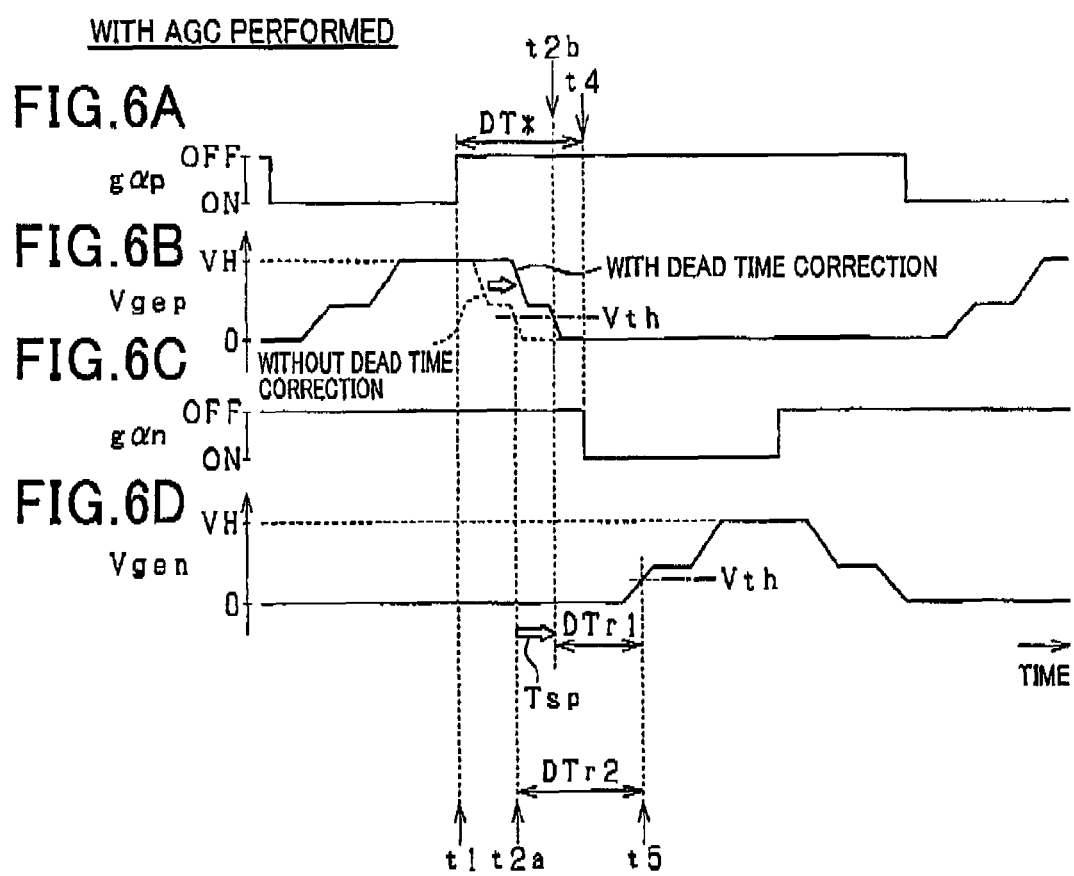
FIGS. 6A-6D show a timing chart for explaining the dead time correction process in accordance with the first embodiment.

FIG. 5 is a flowchart of the dead time correction process of the present embodiment. This process is performed in the drive controller 54, for example, repeatedly every predetermined time interval. The drive controller 54 being hardware, the dead time correction process is practically performed in a logic circuit.

First, in step S10, it is determined whether or not the operation signal gαβ is the turn-on command.

If it is determined in step S10 that the operation signal gαβ is the turn-on command, then the process proceeds to step S12, where the charge switching element 46 is turned on and the first discharge switching element 50a and the second discharge switching element 50b are both tuned off.

Subsequently, in step S14, it is determined within a time period where the operation signal gαβ is the turn-on command, whether or not the sense voltage Vse has exceeded the predetermined voltage Vsh before. This operation is performed to determine whether to perform the discharge process with the active gate control unperformed, while leaving the discharge rate set to the lower rate. This allows the timing of commencing the discharge process to be delayed (in step S26 described later). In the present embodiment, the first determination unit 542 (see FIG. 2B) is a logic circuit section responsible for executing the operation in step S14.

If it is determined in step S14 that the sense voltage Vse has not yet exceeded the predetermined voltage Vsh, then the process proceeds to step S16, where a flag Fa is set to 1, which indicates that the active gate control is to be performed in the discharge process. If it is determined in step S14 that the sense voltage Vse has exceeded the predetermined voltage Vsh before, then the process proceeds to step S18, where the flag Fa is set to 0, which indicates that the active gate control is not to be performed in the discharge process.

In step S20 subsequent to steps S16, S18, it is determined whether or not the operation signal gαβ has been switched from the turn-on command to the turn-off command. If it is determined in step S20 that the operation signal gαβ has not yet been switched from the turn-on command to the turn-off command, then the process returns to step S14. If it is determined in step S20 that the operation signal gαβ has been switched from the turn-on command to the turn-off command, then the process proceeds to step S22, where it is determined whether or not the flag Fa is 1.

If it is determined in step S22 that the flag Fa is 0, then the discharge process is determined to be performed while leaving the discharge rate set to the lower rate. Then, the process proceeds to step S23, where the charge switching element 46 is turned off and the second discharge switching element 50b is turned on.

If it is determined in step S22 that the flag Fa is 1, then it is determined that the active gate control is to be performed in the discharge process. Then, the process proceeds to step S24, where the drive controller 54 waits for a shift time Tsp to elapse from the determination in step S20 that the operation signal gαβ has been switched from the turn-on command to the turn-off command. If it is determined that the shift time Tsp has elapsed, then the process proceeds to step S26, where the charge switching element 46 is turned off and the first discharge switching element 50a and the second discharge switching element 50b are both turned on, which allows the timing of turning on the first discharge switching element 50a and the second discharge switching element 50b to be delayed by the shift time Tsp, thereby delaying the transition of the switching element Sαβ to the OFF state by the shift time Tsp. In the present embodiment, the shift unit 546 (see FIG. 2B) is a logic circuit section responsible for executing the operations in steps S22, S24, S26.

In step S28 subsequent to step S26, the drive controller 54 waits for the sense voltage Vse to rise to the specified voltage V6. This operation is performed to determine whether or not the timing at which the discharge rate is switched from the higher rate to the lower rate is reached. If it is determined in step S28 that the sense voltage Vse has reached the specified voltage V3, then the process proceeds to step S30, where the first discharge switching element 50a is turned off. In the present embodiment, the discharge-rate changing unit 544 (see FIG. 2B) is a logic circuit section responsible for executing the operations in steps S28, S30.

If it is determined in step S10 that the operation signal gαβ is not the turn-on command, or after completion of the operation in step S23 or S30, then the process ends.

FIGS. 6A-6D show an example of the dead time correction process of the present embodiment. FIGS. 6A-6D respectively correspond to FIGS. 4A-4D.

The dead time correction process, as shown in FIGS. 6A-6D, allows the timing at which the upper-arm gate voltage Vgep falls below the threshold voltage Vth to be delayed by the shift time Tsp from time t2a to time t2b. This allows the actual dead time DTr2 to be reduced to the dead time DTr1 assumed at the time of designing. The actual dead time DTr2 is a dead time that occurs immediately after the active gate control is performed.

The present embodiment set forth above can provide the following advantages.

(1) If it is determined within a time period where the upper-arm switching element Sαp (or the lower-arm switching element Sαn) is ON, that the sense voltage Vse has not yet exceeded the predetermined voltage Vsh, the active gate control is determined to be performed in the discharge process. In the active gate control, the timing of switching off the upper-arm switching element Sαp (or the lower-arm switching element Sαn) immediately after the above decision is delayed by the shift time Tsp. This allows the dead time occurring in the subsequent discharge process to approach the dead time DTr1 assumed at the time of designing and can thus prevent the current waveform from the inverter 12 from being much deformed from a sine wave, thereby preventing a torque controlled variable for the motor generator 10 from decreasing.

(2) The drive circuits Drαp, Drαn are configured such that the dead time correction process can be completed respectively in the upper-arm drive circuit Drαp and the lower-arm drive circuit Drαn. This allows the dead time correction process to be performed without using means for communications between the upper-arm drive circuit Drαp and the lower-arm drive circuit Drαn (such as a photocoupler).

(Second Embodiment)

There will now be explained a second embodiment of the present invention. Only differences of the second embodiment from the first embodiment will be explained.

In the first embodiment, the timing of turning on the first discharge switching element 50a and the second discharge switching element 50b during the discharge process is delayed by the shift time Tsp, thereby reducing the dead time. In the present embodiment, the timing of turning on the charge switching element 46 is advanced by the shift time Tsp, thereby reducing the dead time.

Figure 7:
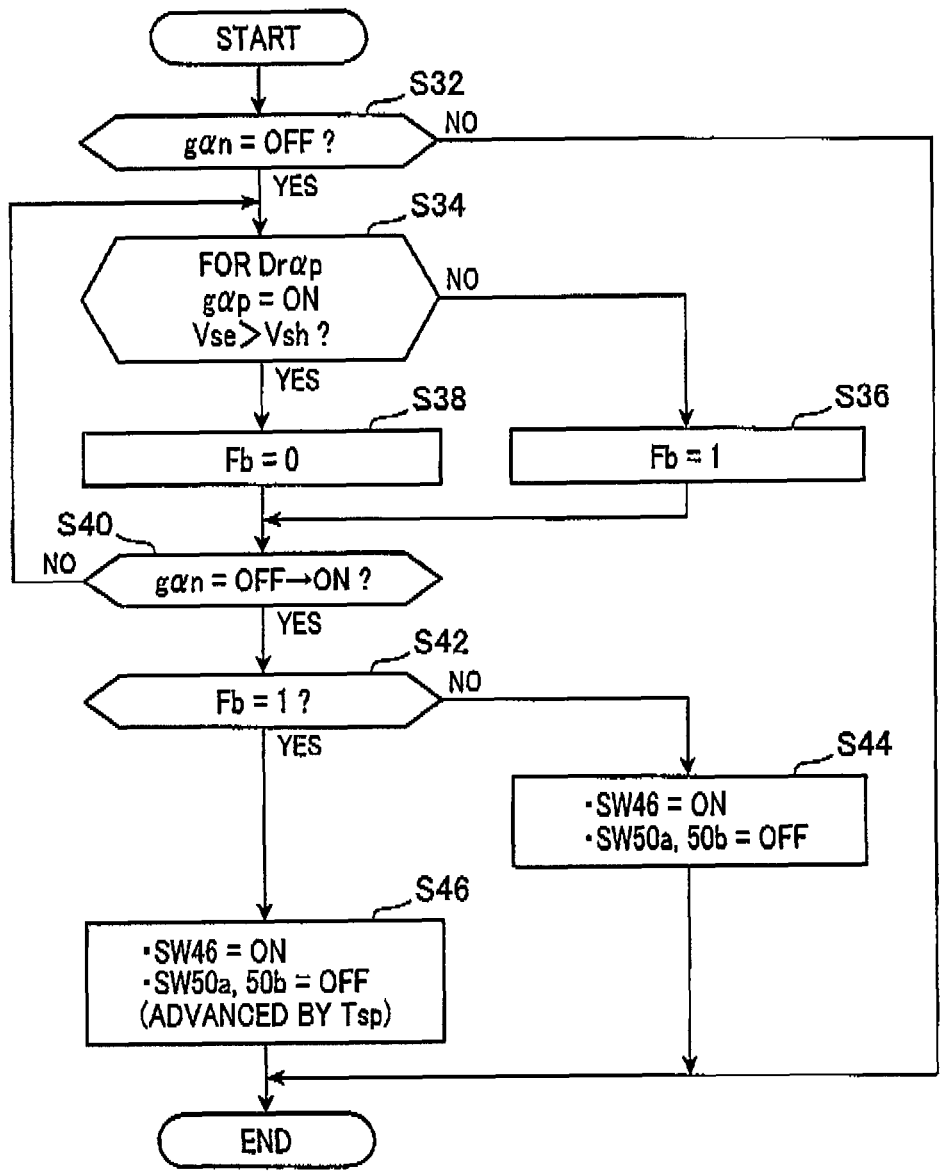
FIG. 7 shows a flowchart of a dead time correction process in accordance with a second embodiment.
Figure 8A:
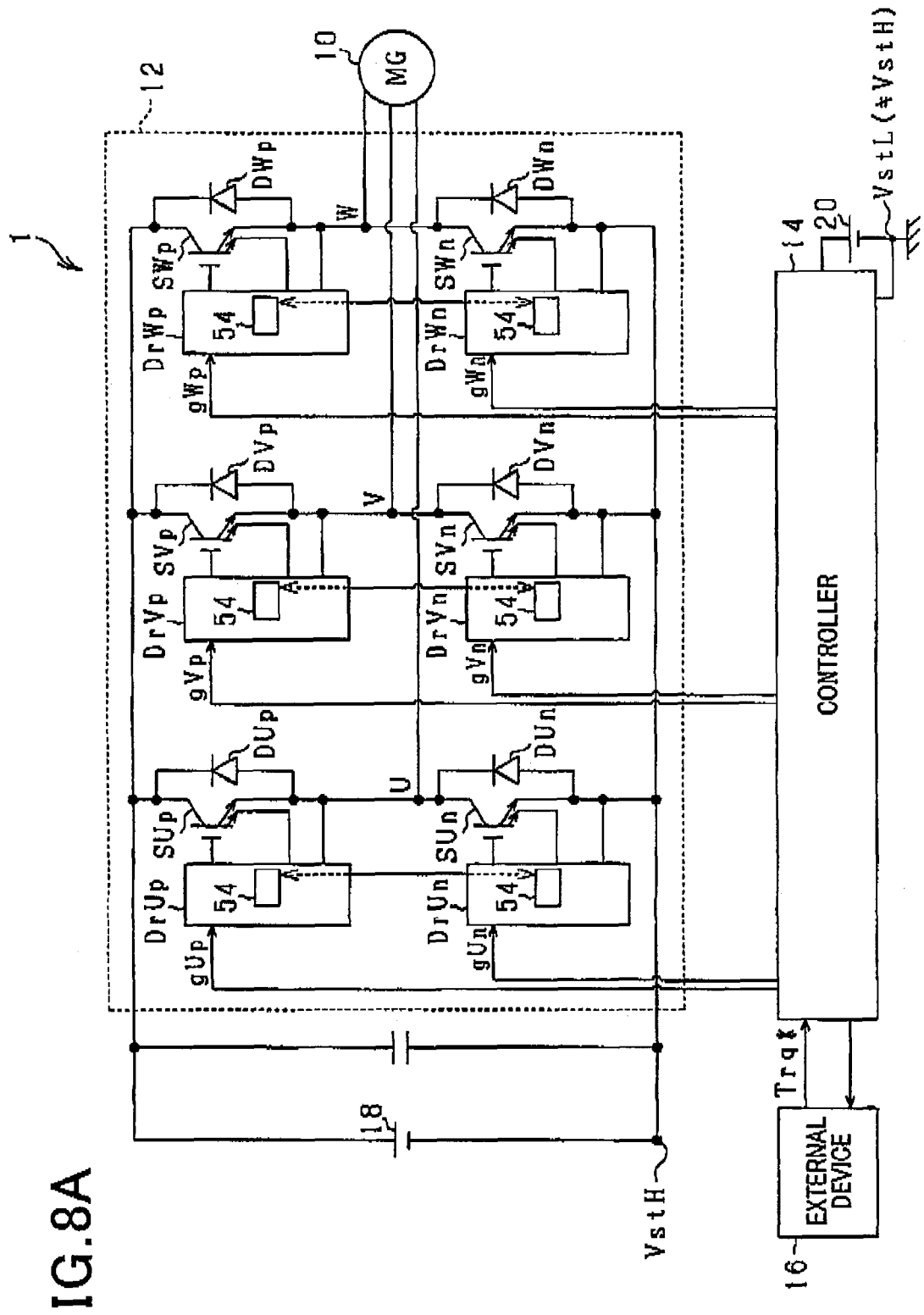
FIG. 8A shows a schematic diagram of a motor control system in accordance with the second embodiment.
Figure 8B:
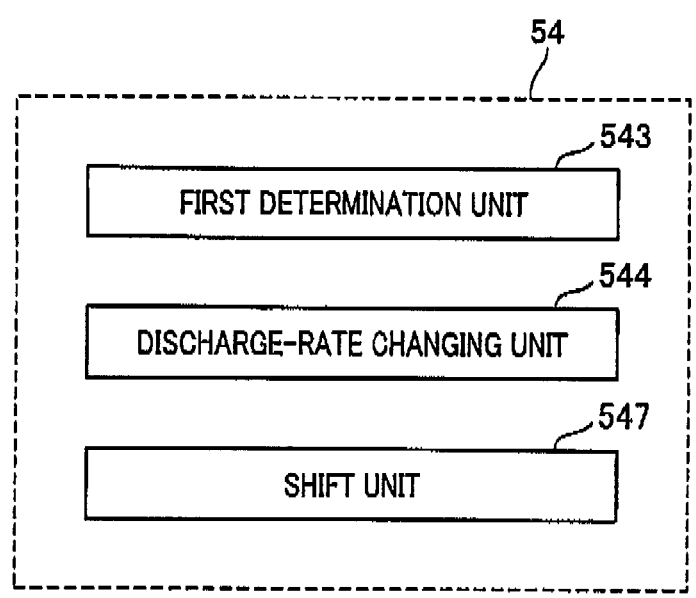
FIG. 8B shows a schematic diagram of a drive controller of FIG. 8A.

FIG. 7 is a flowchart of the dead time correction process of the present embodiment. This process is performed in the drive controller 54 (forming, as an example, the drive lower-arm drive circuit Drαn), for example, repeatedly every predetermined time interval. The drive controller 54 being hardware, the dead time correction process is practically performed in a logic circuit. The drive controller 54 of the present embodiment, as shown in FIG. 8B, includes a first determination unit 543, the discharge-rate changing unit 544, and a shift unit 547.

First, in step S32, it is determined whether or not the lower-arm operation signal gαn is the turnoff command.

If it is determined in step S32 that the lower-arm operation signal gαn is the turn-off command, then the process proceeds to step S34. In step S34, it is determined within a time period where an upper-arm operation signal gαp, which is the counterpart of the lower-arm operation signal gαn, is the turn-on command, whether or not information that the upper-arm sense voltage Vse has exceeded the predetermined voltage Vsh before has been received from the drive controller 54 forming the upper-arm drive circuit Drαp. In the present embodiment, as shown in FIG. 8A, the drive controller 54 forming the upper-arm drive circuit Drαp and the drive controller 54 forming the lower-arm drive circuit Drαn are communicably connected to each other and configured to communicate information therebetween. In the present embodiment, the first determination unit 543 (see FIG. 8B) is a logic circuit section responsible for executing the operation in step S34.

If it is determined in step S34 that the information has not been received from the drive controller 54 forming the upper-arm drive circuit Drαp, then the process proceeds to step S36, where a flag Fb is set to 1. If it is determined in step S34 that the information has been received from the drive controller 54 forming the upper-arm drive circuit Drαp, then the process proceeds to step S38, where the flag Fb is set to 0.

In step S40 subsequent to steps S36, S38, it is determined whether or not the operation signal gαn has been switched from the turn-off command to the turn-on command. If it is determined in step S40 that the operation signal gun has not yet been switched from the turn-off command to the turn-on command, then the process returns to step S34. If it is determined in step S40 that the operation signal gαnβ has been switched from the turn-off command to the turn-on command, then the process proceeds to step S42, where it is determined whether or not the flag Fb is 1.

If it is determined in step S42 that the flag Fb is 0, then the process proceeds to step S44, where the charge switching element 46 is turned on, and the first discharge switching element 50a and the second discharge switching element 50b are both turned off.

If it is determined in step S42 that the flag Fb is 1, then the process proceeds to step S46, where the charge switching element 46 is turned on, and the first discharge switching element 50a and the second discharge switching element 50b are both turned off with the timing of turning on the charge switching element 46 and turning off the first discharge switching element 50a and the second discharge switching element 50b advanced by the shift time Tsp. This allows the timing of turning on the charge switching element 46 to be advanced by the shift time Tsp, thereby advancing the timing of transition of the lower-arm switching element Sαn to the ON state by the shift time Tsp. In the present embodiment, the shift unit 547 (see FIG. 8B) is a logic circuit section responsible for executing the operations in steps S42, S46.

If it is determined in step S32 that the operation signal gαn is not the turn-off command, or after completion of the operation in step S44 or S46, then the process ends.

FIGS. 9A-9D show an example of the dead time correction process of the present embodiment. FIGS. 9A-9D respectively correspond to FIGS. 6A-6D.

As shown in FIGS. 9A-9D, advancing the timing of turning on the charge switching element 46 by the shift time Tsp allows the timing at which the lower-arm gate voltage Vgen becomes equal to or greater than the threshold voltage Vth to be advanced by the shift time Tsp from time t4a to time t4b. This allows the actual dead time DTr3 to be reduced to the dead time DTr1 assumed at the time of designing. The actual dead time DTr3 is a dead time that occurs immediately after the active gate control is performed on the upper-arm side.

The present embodiment can provide similar advantages to those of the first embodiment.

(Third Embodiment)

There will now be explained a third embodiment of the present invention. Only differences of the third embodiment from the first embodiment will be explained.

In the present embodiment, it is determined within a time period where the operation signal gαβ for the switching element Sαβ is the turn-on command, whether or not the discharge process is unable to be performed at the discharge rate set to the higher rate. If it is determined that the discharge process is unable to be performed at the discharge rate set to the higher rate, then the dead time correction process will be inhibited in order to avoid the upper-and-lower-arm short-circuit.

That is, even though the active gate control is performed when the discharge process for which the discharge rate is set to the higher rate is unable to be performed, the turn-off time of the switching element Sαβ becomes equal to the turn-off time of the switching element Sαβ for which the discharge process is performed at the discharge rate set to the lower rate only. Hence the actual dead time becomes the dead time assumed at the time of designing. In such a case, the dead time doesn't have to be reduced. Performing the dead-time correction process when the discharge process is unable to be performed at the discharge rate set to the higher rate may lead to a reduced dead time. Then there may be a concern about occurrence of the upper-and-lower-arm short-circuit.

Figure 10A:
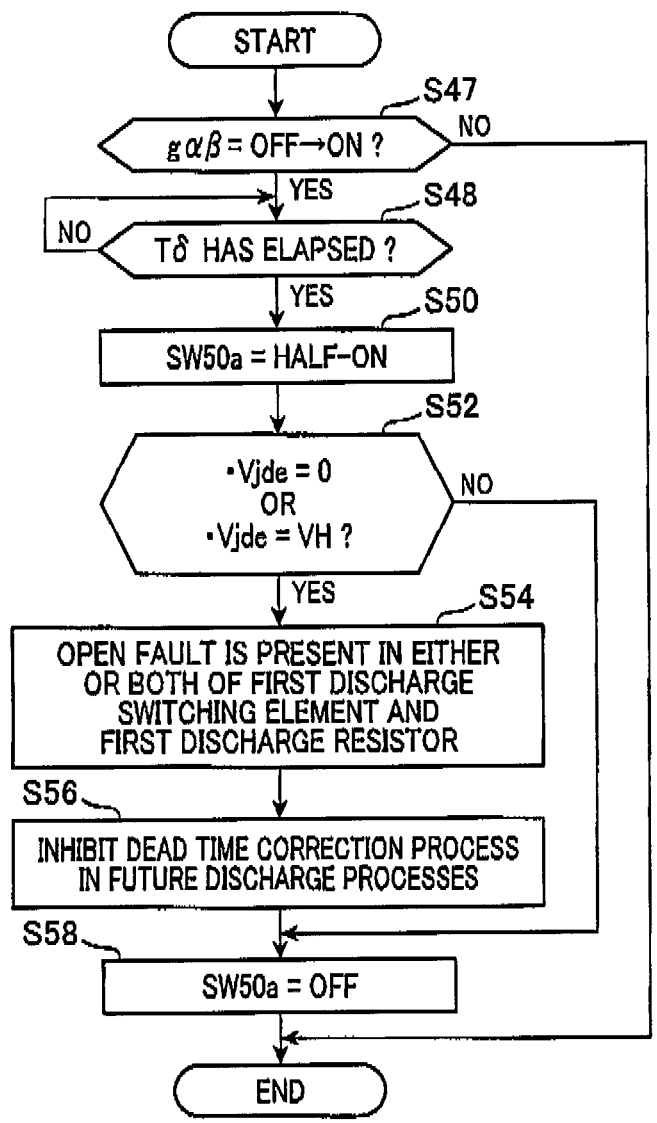
FIG. 10A shows a flowchart of a dead time correction inhibition process in accordance with a third embodiment.
Figure 10B:
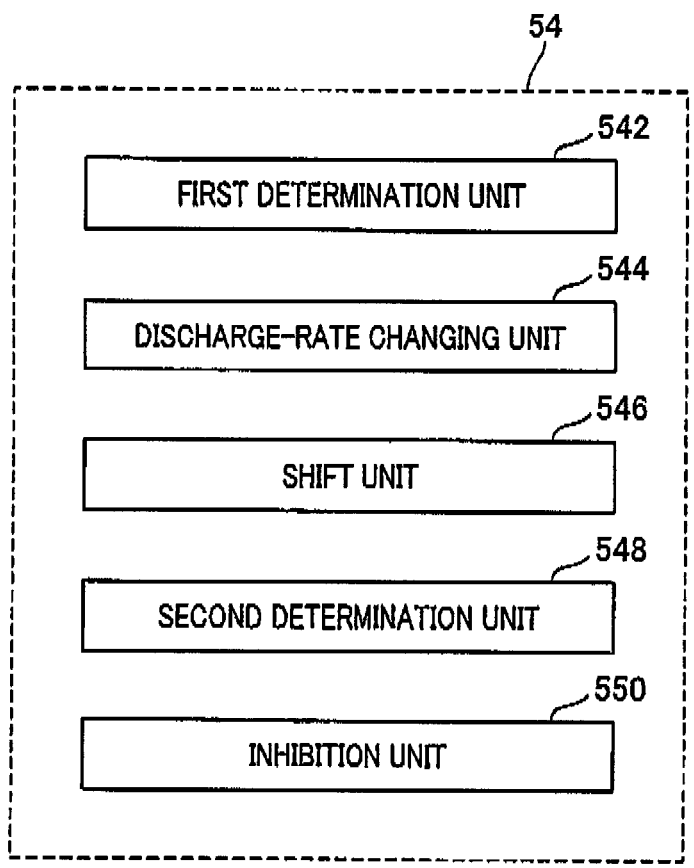
FIG. 10B shows a schematic diagram of a drive controller in accordance with the third embodiment.

FIG. 10A is a flowchart of the dead time correction inhibition process of the present embodiment. This process is performed in the drive controller 54, for example, repeatedly every predetermined time interval. The drive controller 54 being hardware, the dead time correction process is practically performed in a logic circuit. Referring to FIG. 10b, the drive controller 54 of the present embodiment further includes a second determination unit 548 and an inhibition unit 550 as compared with the first embodiment.

First, in step S47, it is determined whether or not the operation signal gαβ has been switched from the turn-off command to the turn-on command.

If it is determined in step S47 that the operation signal gαβ has been switched from the turn-off command to the turn-on command, then the process proceeds to step S48, where the drive controller 54 waits for a predetermined time Tδ to elapse from the decision in step S47. This is done for waiting for the gate voltage Vge to rise to an output voltage VH of the constant-voltage power supply 44.

If it is determined in step S48 that the predetermined time Tδ has elapsed, then the process proceeds to step S50, where the first discharge switching element 50a is put in a half-on state. The half-on state of the switching element Sαβ is such that the gate voltage Vge is set to a voltage at which the switching element Sαβ is operated in its saturation region. The saturation region is a region in which a collector current IC is substantially constant over the collector-emitter voltage Vce of the switching element sαβp, where the collector current Ic is a function of the collector-emitter voltage as the output characteristics.

The operation in step S48 is provided for passing current through a discharge path of gate charge that is a discharge path from the gate to the emitter through the first discharge resistor 48a and the first discharge switching element 50a. Putting the first discharge switching element 50a in the half-on state can suppress the current flowing through the discharge path of gate charge, which can prevent a situation from occurring such that the switching element sαβp becomes unable to be turned on during the charge process.

In step S52 subsequent to step S50, it is determined whether or not the logical OR of the following conditions (i) and (ii) is TRUE: (i) a determination voltage Vjde that is a drain side voltage of the first discharge switching element 50a (see FIG. 2A) is 0, and (ii) a determination voltage Vjde is an output voltage VH of the constant-voltage power supply 44. This operation is provided for determining within a turn-on period of the switching element Sαβ, whether or not there is an open fault in at least one of the first discharge resistor 48a and the first discharge switching element 50a.

That is, the condition that during the charge process the determination voltage Vjde is 0 while the first discharge switching element 50a is in the half-on state corresponds to the presence of an open fault in the first discharge resistor 48a. The condition that during the charge process the determination voltage Vjde is the output voltage VH of the constant-voltage power supply 44 while the first discharge switching element 50a is in the half-on state corresponds to the presence of an open fault in the first discharge switching element 50a. In the present embodiment, the second determination unit 548 (see FIG. 10B) is a logic circuit section responsible for executing the operations in steps S47-S52.

If it is determined the logical OR of the conditions (i) and (ii) is TRUE, then the process proceeds to step S54, where it is determined that there is an open fault in at least one of the first discharge resistor 48a and the first discharge switching element 50a. In step S56, the dead time correction process is determined to be inhibited in future discharge processes. In the present embodiment, the inhibition unit 550 (see FIG. 10B) is a logic circuit section responsible for executing the operation in step S56.

If it is determined in step S47 that the operation signal gαβ has been switched from the turn-off command to the turn-on command, or after completion of the operation in step S58, then the process ends.

The present embodiment can provide not only similar advantages to those of the first embodiment, but also additional advantages as follows.

(3) The dead time correction inhibition process is performed, thereby avoiding unnecessary reduction of the dead time. Thus, the upper-and-lower-arm short-circuit caused by the dead time correction process can be avoided in the presence of an open fault in at least one of the first discharge resistor 48a and the first discharge switching element 50a.

In particular, in the present embodiment, it is determined during the charge process whether or not there is an open fault, which can be a major contribution to rapidly inhibiting the dead time correction process in future discharge processes.

(Fourth Embodiment)

There will now be explained a fourth embodiment of the present invention. Only differences of the third embodiment from the third embodiment will be explained.

In the present embodiment, the technique for the above dead time correction inhibition process is modified.

Figure 11B:
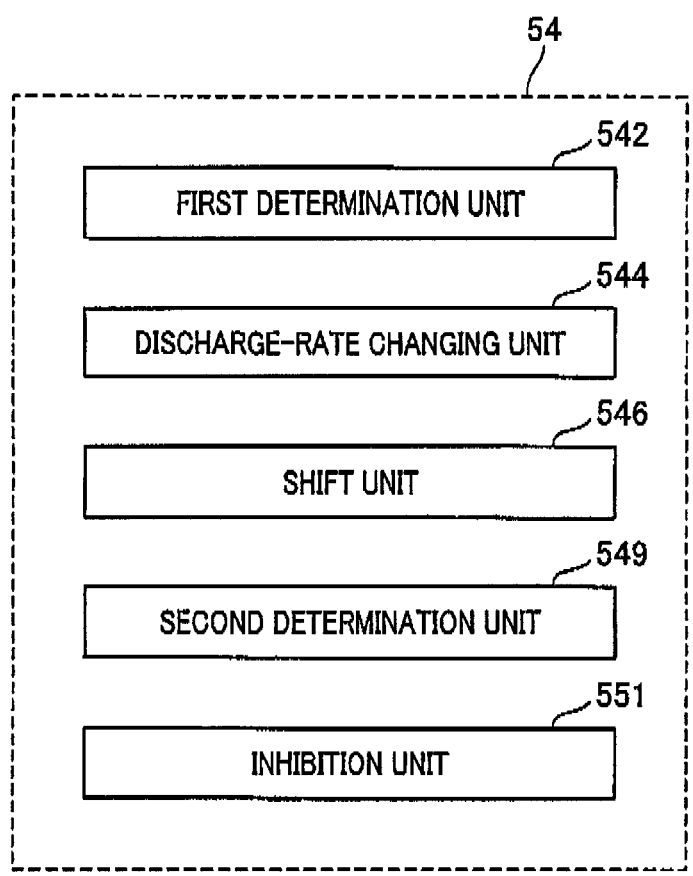
FIG. 11B shows a schematic diagram of a drive controller in accordance with the fourth embodiment.

FIG. 11A is a flowchart of the dead time correction inhibition process of the present embodiment. This process is performed in the drive controller 54, for example, repeatedly every predetermined time interval. The drive controller 54 being hardware, the dead time correction process is practically performed in a logic circuit. Like numbers refer to like steps throughout. Referring to FIG. 11b, the drive controller 54 of the present embodiment further includes a second determination unit 549 and an inhibition unit 551 as compared with the first embodiment.

First, in step S60, it Is determined whether or not the operation signal gαβ has been switched from the turn-on command to the turn-off command.

If it is determined in step 60 that the operation signal gαβ has been switched from the turn-on command to the turn-off command, then the process proceeds to step S62. In step S62, it is determined whether or not the first discharge switching element 50a is in a ON state. This operation is performed to determine whether or not the current is flowing through the discharge path of gate charge. That is, in the present embodiment, the presence or absence of an open fault is determined with use of the discharge process.

It is determined in step S62 that the first discharge switching element 50a is in a ON state, then the process proceeds to step S52. If it is determined in step S52 that the logical OR of the conditions (i) and (ii) is TRUE, then the process proceeds to step S64 through step S54. In step S64, the dead time correction process is determined to be inhibited in future discharge processes. In the present embodiment, the second determination unit 549 (see FIG. 11B) is a logic circuit section responsible for executing the operations in steps S60-S52, and the inhibition unit 551 (see FIG. 11B) is a logic circuit section responsible for executing the operation in step S64.

If the determination is negative in step S60, S62 or S52, or after completion of the operation in step S64, then the process ends.

The present embodiment can provide similar advantages to those of the third embodiment.

(Fifth Embodiment)

There will now be explained a fifth embodiment of the present invention. Only differences of the fifth embodiment from the first embodiment will be explained.

In the present embodiment, the shift time Tsp used in the dead time correction process may be variably set in response to a detection value of the element temperature of the temperature-sensitive diode 56.

Figure 12:
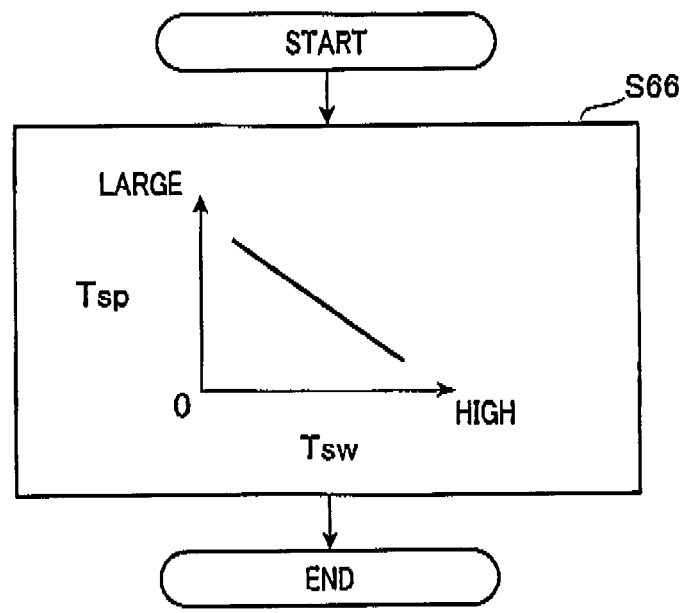
FIG. 12 shows a flowchart of a shift time correction process in accordance with a fifth embodiment.

FIG. 12 is a flowchart of a shift time setting process of the present embodiment. This process is performed in the drive controller 54, for example, repeatedly every predetermined time interval. The drive controller 54 being hardware, the dead time correction process is practically performed in a logic circuit.

Figure 13:
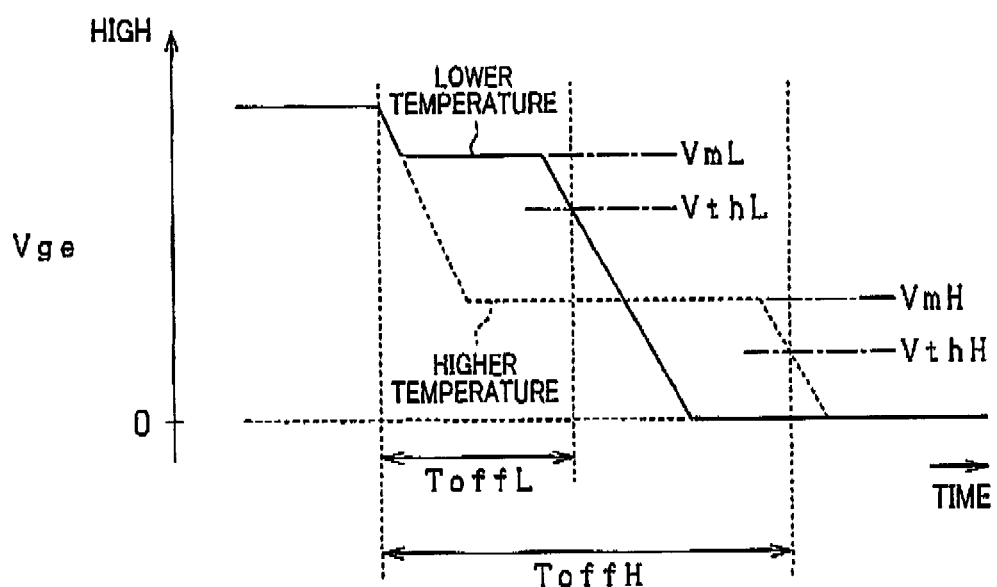
FIG. 13 shows a relationship of an element temperature and a threshold voltage.

In this shift time setting process, in step S66, the shift time Tsp is set to a greater value for a lower element temperature Tsw. This process is performed for enhancing the dead time correction accuracy. As shown in FIG. 13, a turn-off time ToffL at a lower element temperature Tsw is less than a turn-off time ToffZH at a higher element temperature Tsw. This comes from the fact that since a Miller voltage VmL at a lower element temperature Tsw is greater than a Miller voltage VmH at a higher element temperature Tsw, a threshold voltage VthL at a lower element temperature Tsw becomes greater than a threshold voltage VthH time ToffH at a higher element temperature Tsw. Thus, correcting the shift time Tsp based on the element temperature Tsw can enhance the dead time correction accuracy.

With such a dead time correction technique, the timing of turning on the first and second discharge switching elements 50a, 50b may be delayed by a larger time at a lower element temperature Tsw. FIG. 12 shows a graph of shift time Tsp vs. element temperature Tsw such that the shift time Tsp is monotonically increased with a decreasing element temperature Tsw. Alternatively, the shift time Tsp may be set to a value that is increased in step increments with a decreasing element temperature Tsw. In the present embodiment, the shift unit 546 (see FIG. 2B) is further responsible for executing the operation in step S66 of the shift time setting process.

After completion of step S66, the process ends.

The configuration of the present embodiment set forth above allows the actual dead time to advantageously approach the dead time assumed at the time of designing.

(Other Embodiments)

The present invention is described above referring to some specific embodiments. However, the present invention is not limited to the specific embodiments. The configuration and detailed parts of the present invention can be variously modified within a scope of the present invention to be understood by those skilled in the art.

In the first and second embodiment, given the shift time Tsp taking a positive value, the shift unit 546(547) is configured to shift in time at least one of transition to an OFF state of one of the upper-arm switching element Sαp and the lower-arm switching element Sαn and transition to an ON state of the other of the upper-arm switching element (Sαp) and the lower-arm switching element Sαn that is immediately after the transition to the OFF state so as to reduce a time difference between the transition to the OFF state and the transition to the ON state alternatively, the shift unit 546(547) may be configured to shift in time both transition to an OFF state of one of the upper-arm switching element Sαp and the lower-arm switching element Sαn and transition to an ON state of the other of the upper-arm switching element (Sαp) and the lower-arm switching element Sαn that is immediately after the transition to the OFF state so as to reduce a time difference between the transition to the OFF state and the transition to the ON state. In such an embodiment, for example, transition to an OFF state of one of the upper-arm switching element Sαp and the lower-arm switching element Sαn may be delayed by a half of the shift time Tsp (Tsp/2) and transition to an ON state of the other of the upper-arm switching element Sαp and the lower-arm switching element Sαn that is immediately after the transition to the OFF state may be advanced by a half of the shift time Tsp (Tsp/2).

In some alternative embodiments, the first determination unit 542(543) may be configured as follows.

As disclosed in Japanese Patent Application Laid-Open Publication No. 2013-143582, when it is determined that the sense voltage else of the switching element $S\alpha\beta$ has exceeded a predetermined value within a time period where the switching element $S\alpha\beta$ is left ON, the discharge process may be performed at the discharge rate left set to a higher rate without the active control performed. The predetermined value is set greater than zero and less than the predetermined voltage Vsh. For example, given the dead time set at the time of designing such that the upper-and-lower-arm short-circuit can be avoided when the active gate control performed, the dead time that occurs when the discharge process is performed at the discharge rate left set to the higher rate may become excessively large as compared with the dead time assumed at the time of designing. Therefore, the first determination unit 542(543) may be configured such that whether or not the dead time that subsequently occurs becomes greater than the dead time assumed at the time of designing may be determined based on whether or not the discharge process is performed at the discharge rate left set to the higher rate without the active control performed.

The first determination unit 542(543) may be configured to select one of (a) the discharge rate is left set to the lower rate, (b) the active gate control is performed, and (c) the discharge rate is left set to the higher rate, based on greater than and less than comparison between the predetermined value, the predetermined voltage Vsh, and the sense voltage Vse. In such an embodiment, at the time of designing, for example, the dead time may be determined so as to avoid the upper-and-lower-arm short-circuit when the discharge rate is left set to the lower rate during the discharge process. When the first determination unit 542(543) is only allowed to select one of (b) the active gate control is performed and (c) the discharge rate is left set to the higher rate, there may be a concern that the dead time may become excessively large as compared with the dead time assumed at the time of designing. Therefore, application of the dead time correction process may be effective.

In each of the above embodiment, the dead time correction process and the dead time correction inhibition process are performed in the drive controller 54. Alternatively, the dead time correction process and the dead time correction inhibition process may be performed, for example, in the external device 16. In such an embodiment, the external device 16 may include the first determination unit 542(543) and the shift unit 546(547). Based on the sense voltage Vse conveyed from the high-voltage system to the external device 16, the time difference DT* between the transition to the turn-off command of one of the upper-arm operation signal $g\alpha p$ and the lower-arm operation signal $g\alpha n$ and the transition to the turn-on command of the other of the upper-arm operation signal $g\alpha p$ and the lower-arm operation signal gory may be shifted by a shift time Tsp. In this case, the motor control system 1 may be provided with means for conveying information from the high-voltage system to external device as the low-voltage system with the high-voltage system and the low-voltage system electrically isolated from each other (e.g., a photocoupler).

In the above embodiments, the first determination unit 542(543) determines to perform the discharge process at the discharge rate left set to the lower rate when it is determined that the sense voltage Vse has exceeded the predetermined voltage Vsh. Alternatively, the first determination unit 542 (543) may be configured to determine to perform the discharge process at the discharge rate left set to the lower rate when it is determined that the element temperature has become lower than a pre-defined temperature. This takes into account the fact that the breakdown voltage of the switching element $S\alpha\beta$ (an acceptable upper limit of the collector-emitter voltage Vce) decreases with decreasing element temperature.

In the above embodiments, the setting of discharge rate is changed when the sense voltage Vse has reached the specified voltage V. Alternatively, the setting of discharge rate may be changed when a prescribed time period has elapsed from time t1 (see FIGS. 3A-3D). The prescribed time period may be defined such that the surge voltage and the switching losses that will occur upon transition of the switching element $S\alpha\beta$ from the ON state to the OFF state can be reduced.

In the third embodiment, the technique is described for determining whether or not an open fault is present in the series connection of the first discharge resistor 48a and the first discharge switching element 50a during the charge process. Alternatively, a closed loop circuit formed of the series connection of the first discharge resistor 48a and the first discharge switching element 50a and a DC power source (herein referred to as a diagnostic power supply) connected in parallel with the series connection, with an electrically operated switch in provided along the loop circuit, may be used to determine whether or not an open fault is present in the series connection of first discharge resistor 48a and the first discharge switching element 50a. The loop circuit is closed by turning on the switch. Then, whether or not an open fault is present in the series connection of first discharge resistor 48a and the first discharge switching element 50a may be determined based on the determination voltage Vjge during the charge process.

In the second to fourth embodiments, the shift time Tsp may be variably set as in the fifth embodiment. When the second embodiment is configured such that the shift time Tsp can be variably set, the timing of turning on the charge switching element 45 may be advance by a variable shift time Tsp that is increased with decreasing element temperature Tsw. The configurations of the third and/or fourth embodiments may be applied to the second embodiment.

The discharge-rate changing unit 544 is configured as shown in FIG. 2A. In some alternative embodiments, the discharge-rate changing unit 544 may be configured as follows.

The resistance value of the first discharge resistor 48a may be set less than the resistance value of the second discharge resistor 48b. With this configuration, when the discharge rate is set to a higher rate, the first discharge switching element 50a may be turned on and the second discharge switching element 50b may be turned off. When the discharge rate is set to a lower rate, the first discharge switching element 50a may be turned off and the second discharge switching element 50b may be tuned on.

In the above embodiments, the discharge-rate changing unit 544 is configured to change the resistance value of the discharge path as described in the first embodiment.

An electrically operated element (e.g., a MOSFET) may be provided along a discharge path electrically connected to the gate, where the element can switch between a first connection between the emitter and the gate and a second connection between a portion of a lower potential than the emitter and the gate. With such a configuration, the element may be operated so as to connect the portion of a lower potential and the gate only at an initial stage of the discharge process. Thereafter, the element may be operated so as to connect the emitter and the gate. This allows the discharge rate to be changed to a lower rate.

In the above embodiments, the discharge-rate changing unit 544 is configured to change the discharge rate in a stepwise manner. Alternatively, the discharge-rate changing unit 544 may be configured to change the discharge rate continuously. Even in such an embodiment, the actual dead time may become excessively large as compared with the dead time assumed at the time of designing. Therefore, the dead time correction process as described above may also be available in such an embodiment.

The second determination unit 548(549) is configured as described in the third embodiment. Alternatively, a unit configured to be able to determine whether or not there is an electrically interrupted portion along a discharge path for discharging the gate charge from the gate to the emitter may be used as the second determination unit 548(549).

In the above embodiments, the DC power source is a battery (the high-voltage battery 18). Alternatively, when a boost converter is provided between the high-voltage battery 18 and the inverter 12, such a boost converter may be used as the DC power source.

In the above embodiments, the power conversion circuit is the three-phase inverter. Alternatively, a full-bridge circuit or other power conversion circuits may be used. In addition, in the above embodiments, the upper-arm switching element and the lower-arm switching element forming the power conversion circuit are IGBTs. Alternatively, the upper-arm switching element and the lower-arm switching element may be MOSFETs.

What is claimed is:

1. A driving apparatus for driving switching elements of a power conversion circuit, the power conversion circuit having a series connection of an upper-arm switching element and a lower-arm switching element, the series connection being electrically connected in parallel with a direct-current (DC) power source, the apparatus comprising:
    an upper-arm drive control unit configured to turn on or off the upper-arm switching element by charging or discharging the charge on a switching control terminal of the upper-arm switching element, the upper-arm drive control unit being configured to set a dead time for preventing both of the upper-arm switching element and the lower-arm switching element from being ON, the dead time taking a positive value; and
    a lower-arm drive control unit configured to turn on or off the lower-arm switching element by charging or discharging the charge on a switching control terminal of the lower-arm switching element, the lower-arm drive control unit being configured to set the dead time for preventing both of the upper-arm switching element and the lower-arm switching element from being ON,
    wherein the upper-arm drive control unit comprises:
        an upper-arm discharge-rate changing unit configured to, during on-operation of the upper-arm switching element, change a setting of discharge rate at which the charge on the switching control terminal of the upper-arm switching element is discharged;
        an upper-arm first determination unit configured to, during the on-operation of the upper-arm switching element, determine whether or not the dead time that occurs immediately after commencement of off-operation of the upper-arm switching element is greater than the dead time assumed at the time of designing the apparatus under the setting changed by the upper-arm discharge-rate changing unit; and
        an upper-arm shift unit configured to, if it is determined by the upper-arm first determination unit that the dead time occurring immediately after the commencement of the off-operation of the upper-arm switching element is greater than the dead time assumed at the time of designing the apparatus, delay commencement of off-operation of the upper-arm switching element so as to reduce a time difference between the commencement of the off-operation of the upper-arm switching element and commencement of on-operation of the lower-arm switching element, and
    the lower-arm drive control unit comprises:
        a lower-arm discharge-rate changing unit configured to, during on-operation of the lower-arm switching element, change a setting of discharge rate at which the charge on the switching control terminal of the lower-arm switching element is discharged;
        a lower-arm first determination unit configured to, during the on-operation of the lower-arm switching element, determine whether or not the dead time that occurs immediately after commencement of off-operation of the lower-arm switching element is greater than the dead time assumed at the time of designing the apparatus under the setting changed by the lower-arm discharge-rate changing unit; and
        a lower-arm shift unit configured to, if it is determined by the lower-arm first determination unit that the dead time occurring immediately after the commencement of the off-operation of the lower-arm switching element is greater than the dead time assumed at the time of designing the apparatus, delay the commencement of the off-operation of the lower-arm switching element so as to reduce a time difference between the commencement of the off-operation of the lower-arm switching element and commencement of on-operation of the upper-arm switching element.

2. The driving apparatus of claim 1, wherein
the upper-arm discharge-rate changing unit is configured to change the discharge rate from a higher rate to a lower rate during a time period from start to completion of discharging the charge on the switching control terminal of the upper-arm switching element,
the lower-arm discharge-rate changing unit is configured to change the discharge rate from a higher rate to a lower rate during a time period from start to completion of discharging the charge on the switching control terminal of the lower-arm switching element,
the upper-arm first determination unit is configured to determine whether or not the dead time that occurs immediately after the commencement of the off-operation of the upper-arm switching element is greater than the dead time assumed at the time of designing the apparatus based on whether or not discharging of the charge on the switching control terminal of the upper-arm switching element is performed with the discharge rate left at the lower rate without being changed by the upper-arm discharge-rate changing unit during the time period from start to completion of discharging the charge on the switching control terminal of the upper-arm switching element, and
the lower-arm first determination unit is configured to determine whether or not the dead time that occurs immediately after the commencement of the off-operation of the lower-arm switching element is greater than the dead time assumed at the time of designing the apparatus based on whether or not discharging of the charge on the switching control terminal of the lower-arm switching element is performed with the discharge rate left at the lower rate without being changed by the lower-arm discharge-rate changing unit during the time period from start to completion of discharging the charge on the switching control terminal of the lower-arm switching element.

3. The driving apparatus of claim 2, further comprising:
an upper-arm current detection unit configured to detect current flowing through the upper-arm switching element, and
a lower-arm current detection unit configured to detect current flowing through the lower-arm switching element,
the upper-arm first determination unit is configured to determine whether or not the current detected by the upper-arm current detection unit is greater than a pre-defined value, and if it is determined that the current detected by the upper-arm current detection unit is greater than the pre-defined value, determine that the discharging of the charge on the switching control terminal of the upper-arm switching element is performed with the discharge rate left at the lower rate without being changed by the upper-arm discharge-rate changing unit during the time period from start to completion of discharging the charge on the switching control terminal of the upper-arm switching element, and
the lower-arm first determination unit is configured to determine whether or not the current detected by the lower-arm current detection unit is greater than a pre-defined value, and if it is determined that the current detected by the lower-arm current detection unit is greater than the pre-defined value, determine that the discharging of the charge on the switching control terminal of the lower-arm switching element is performed with the discharge rate left at the lower rate without being changed by the lower-arm discharge-rate changing unit during the time period from start to completion of discharging the charge on the switching control terminal of the lower-arm switching element.

4. The driving apparatus of claim 2, wherein
the upper-arm drive control unit comprises:
an upper-arm second determination unit configured to determine whether or not the discharging of the charge on the switching control terminal of the upper-arm-switching element is disabled at the discharge rate set to the higher rate; and
an upper-arm inhibition unit configured to, if it is determined by the upper-arm second determination unit that the discharging of the charge on the upper-arm switching control terminal of the upper-arm switching element is disabled at the discharge rate set to the higher rate, inhibit the upper-arm shift unit from delaying the commencement of off-operation of the upper-arm switching element, and
the lower-arm drive control unit comprises:
a lower-arm second determination unit configured to determine whether or not the discharging of the charge on the switching control terminal of the lower-arm-switching element is unable at the discharge rate set to the higher rate, and
a lower-arm inhibition unit configured to, if it is determined by the lower-arm second determination unit that the discharging of the charge on the switching control terminal of the lower-arm switching element is unable at the discharge rate set to the higher rate, inhibit the lower-arm shift unit from delaying the commencement of off-operation of the lower-arm switching element.

5. The driving apparatus of claim 4, wherein
the upper-arm second determination unit is configured to, during the off-operation of the upper-arm switching element, determine whether or not the discharging of the charge on the switching control terminal of the upper-arm switching element is disabled,
the upper-arm inhibition unit is configured to, if it is determined by the upper-arm second determination unit that the discharging of the charge on the switching control terminal of the upper-arm switching element is disabled, thereafter inhibit the upper-arm shift unit from delaying the commencement of off-operation of the upper-arm switching element,
the lower-arm second determination unit is configured to, during the off-operation of the lower-arm switching element, determine whether or not the discharging of the charge on the switching control terminal of the lower-arm switching element is disabled, and
the lower-arm inhibition unit is configured to, if it is determined by the lower-arm second determination unit that the discharging of the charge on the switching control terminal of the lower-arm switching element is disabled, thereafter inhibit the lower-arm shift unit from delaying the commencement of off-operation of the lower-arm switching element.

6. The driving apparatus of claim 4, wherein
the upper-arm second determination unit is configured to, during the off-operation of the upper-arm switching element, determine whether or not the discharging of the charge on the switching control terminal of the upper-arm switching element is disabled,
the upper-arm inhibition unit configured to, if it is determined by the upper-arm second determination unit that the discharging of the charge on the switching control terminal of the upper-arm switching element is disabled, thereafter inhibit the upper-arm shift unit from delaying the commencement of off-operation of the upper-arm switching element,
the lower-arm second determination unit is configured to, within an off-operation period of the lower-arm switching element, determine whether or not the discharging of the charge on the switching control terminal of the lower-arm switching element is disabled, and
the lower-arm inhibition unit configured to, if when it is determined by the lower-arm second determination unit that the discharging of the charge on the lower-arm switching control terminal of the lower-arm switching element is disabled, thereafter inhibit the lower-arm shift unit from shifting in time the transition to the OFF state of the lower-arm switching element.

7. The driving apparatus of claim 1, further comprising:
an upper-arm temperature detection unit configured to detect a temperature of the upper-arm switching element; and
a lower-arm temperature detection unit configured to detect a temperature of the lower-arm switching element;
the upper-arm shift unit is configured to delay the commencement of the off-operation of the upper-arm switching element by an increased amount of time with lowering temperature detected by the upper-arm temperature detection unit to reduce the time difference between the commencement of the off-operation of the upper-arm switching element and the commencement of the on-operation of the lower-arm switching element, and
the lower-arm shift unit is configured to delay the commencement of the off-operation of the lower-arm switching element by an increased amount of time with lowering temperature detected by the lower-arm temperature detection unit to reduce the time difference between the commencement of the off-operation of the lower-arm switching element and the commencement of the on-operation of the upper-arm switching element.

8. A driving apparatus for driving switching elements of a power conversion circuit, the power conversion circuit having a series connection of an upper-arm switching element and a lower-arm switching element, the series connection being electrically connected in parallel with a direct-current (DC) power source, the apparatus comprising:

a drive control unit configured to, for each of the upper-arm switching element and the lower-arm switching element, turn on or off the switching element by charging or discharging the charge on a switching control terminal of the switching element, the drive control unit being configured to set a dead time for preventing both of the upper-arm switching element and the lower-arm switching element from being ON, the dead time taking a positive value;

a discharge-rate changing unit configured to change a setting of discharge rate at which the charge on the switching control terminal of each of the upper-arm switching element and the lower-arm switching element is discharged;

a first determination unit configured to determine whether or not the dead time that occurs immediately after the setting of discharge rate is changed by the discharge-rate changing unit is greater than the dead time assumed at the time of designing the apparatus; and a shift unit configured to, when it is determined by the first determination unit that the dead time occurring immediately after the setting of discharge rate is changed by the discharge-rate changing unit is greater than the dead time assumed at the time of designing the apparatus, shift in time at least one of transition to an OFF state of one of the upper-arm switching element and the lower-arm switching element and transition to an ON state of the other of the upper-arm switching element and the lower-arm switching element that is immediately after the transition to the OFF state so as to reduce a time difference between the transition to the OFF state and the transition to the ON state; wherein the discharge-rate changing unit is configured to change the discharge rate from a higher rate to a lower rate within a time period from start to completion of discharging the charge on the switching control terminal each of the upper-arm switching element and the lower-arm switching element, the first determination unit configured to determine whether or not the dead time that occurs immediately after the setting of discharge rate is changed by the discharge-rate changing unit is greater than the dead time assumed at the time of designing the apparatus based on whether or not discharging of the charge on the switching control terminal of each of the upper-arm switching element and the lower-arm switching element is performed with the discharge rate left set to the lower rate without being changed by discharge-rate changing unit the driving apparatus further comprises:

a second determination unit configured to determine, for each of the upper-arm switching element and the lower-arm switching element, whether or not the discharging of the charge on the switching control terminal of the switching element is unable to be performed at the discharge rate set to the higher rate; and an inhibition unit configured to, when it is determined by the second determination unit that the discharging of the charge on the switching control terminal of at least one of the upper-arm switching element and the lower-arm switching element is unable to be performed at the discharge rate set to the higher rate, inhibit the shift unit from shifting in time at least one of the transition to the OFF state and the transition to the ON state.

9. The driving apparatus of claim 8, wherein the second determination unit is configured to, for each of the upper-arm switching element and the lower-arm switching element, within an on-operation period of the switching element, determine whether or not the discharging of the charge on the switching control terminal of the switching element is unable to be performed; and the inhibition unit is configured to, when it is determined by the second determination unit that the discharging of the charge on the switching control terminal of at least one of the upper-arm switching element and the lower-arm switching element is unable to be performed, thereafter inhibit the shift unit from shifting in time at least one of the transition to the OFF state and the transition to the ON state.

10. The driving apparatus of claim 8, wherein the second determination unit is configured to, for each of the upper-arm switching element and the lower-arm switching element, within an off-operation period of the switching element, determine whether or not the discharging of the charge on the switching control terminal of the switching element is unable to be performed; and the inhibition unit configured to, when it is determined by the second determination unit that the discharging of the charge on the switching control terminal of at least one of the upper-arm switching element and the lower-arm switching element is unable to be performed, thereafter inhibit the shift unit from shifting in time at least one of the transition to the OFF state and the transition to the ON state.

* * * * *